US012604765B2

(12) United States Patent
Chen et al.

(10) Patent No.:  US 12,604,765 B2
(45) Date of Patent:      Apr. 14, 2026

(54) INTEGRATED PASSIVE DEVICE DIES AND METHODS OF FORMING AND PLACEMENT OF THE SAME

(71) Applicant: Taiwan Semiconductor Manufacturing Company Limited, Hsinchu (TW)

(72) Inventors: Hsien-Wei Chen, Hsinchu (TW); Chun Huan Wei, Hsinchu (TW); Meng-Liang Lin, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 762 days.

(21) Appl. No.: 17/869,906

(22) Filed: Jul. 21, 2022

(65) Prior Publication Data

US 2024/0030199 A1      Jan. 25, 2024

(51) Int. Cl.
*H01L 25/16*      (2023.01)
*H01L 23/10*      (2006.01)
(Continued)

(52) U.S. Cl.
CPC .............. *H01L 25/16* (2013.01); *H01L 23/10* (2013.01); *H01L 23/544* (2013.01);
(Continued)

(58) Field of Classification Search
CPC ....... H01L 23/10; H01L 23/544; H01L 25/16; H01L 2223/54426; H01L 2223/5448; H10D 84/01; H10D 89/011
See application file for complete search history.

(56) References Cited

U.S. PATENT DOCUMENTS 10,504,852 B1 *  12/2019  Chen ................... H01L 25/0657
2012/0175728 A1 *  7/2012  Yang ..................... H01L 23/564
                                                      257/E21.24
(Continued)

FOREIGN PATENT DOCUMENTS

CN        102881678 A  *  1/2013  ........... H01L 23/544
CN        104051429 A      9/2014
(Continued)

OTHER PUBLICATIONS

TW Patent and Trademark Office; TW Application No. 112100802; office action mailed May 2, 2024; 10 pages.

*Primary Examiner* — Matthew E Warren
(74) *Attorney, Agent, or Firm* — The Marbury Law Group, PLLC

(57) ABSTRACT

An embodiment semiconductor device includes an interposer, a semiconductor die electrically connected to the interposer, an integrated passive device die electrically connected to the interposer, the integrated passive device die including two or more seal rings, and a first alignment mark formed on the integrated passive device die within a first area enclosed by a first one of the two or more seal rings. The integrated passive device die may further include two or more integrated passive devices located within respective areas enclosed by respective ones of the two or more seal rings. Each of the two or more integrated passive devices may include electrical connections that are formed as a plurality of micro-bumps, and the first alignment mark may be electrically isolated from the electrical connections, and the first alignment mark and the electrical connections may share a common material.

20 Claims, 16 Drawing Sheets

(51) Int. Cl.
    *H01L 23/544*        (2006.01)
    *H10D 84/01*        (2025.01)
    *H10D 89/00*        (2025.01)

(52) U.S. Cl.
    CPC ............... *H01L 2223/54426* (2013.01); *H01L*
        *2223/5448* (2013.01); *H10D 84/01* (2025.01);
        *H10D 89/011* (2025.01)

(56)         References Cited

U.S. PATENT DOCUMENTS

| | | | |
|---|---|---|---|
| 2018/0315723 A1* | 11/2018 | Singh | H01L 24/06 |
| 2019/0164899 A1* | 5/2019 | Hu | G03F 1/42 |
| 2021/0098409 A1* | 4/2021 | Chen | H01L 23/544 |
| 2021/0134611 A1 | 5/2021 | Liu et al. | |
| 2021/0317826 A1 | 10/2021 | Ike | |
| 2023/0290746 A1* | 9/2023 | Su | H10D 1/716 |
| 2023/0402406 A1* | 12/2023 | Huang | H01L 21/78 |

FOREIGN PATENT DOCUMENTS

| | | | | |
|---|---|---|---|---|
| JP | 2019114673 A | * | 7/2019 | ....... H01L 21/76224 |
| TW | 201824462 A | | 7/2018 | |
| TW | 202119496 A | | 5/2021 | |

* cited by examiner

112a

112a

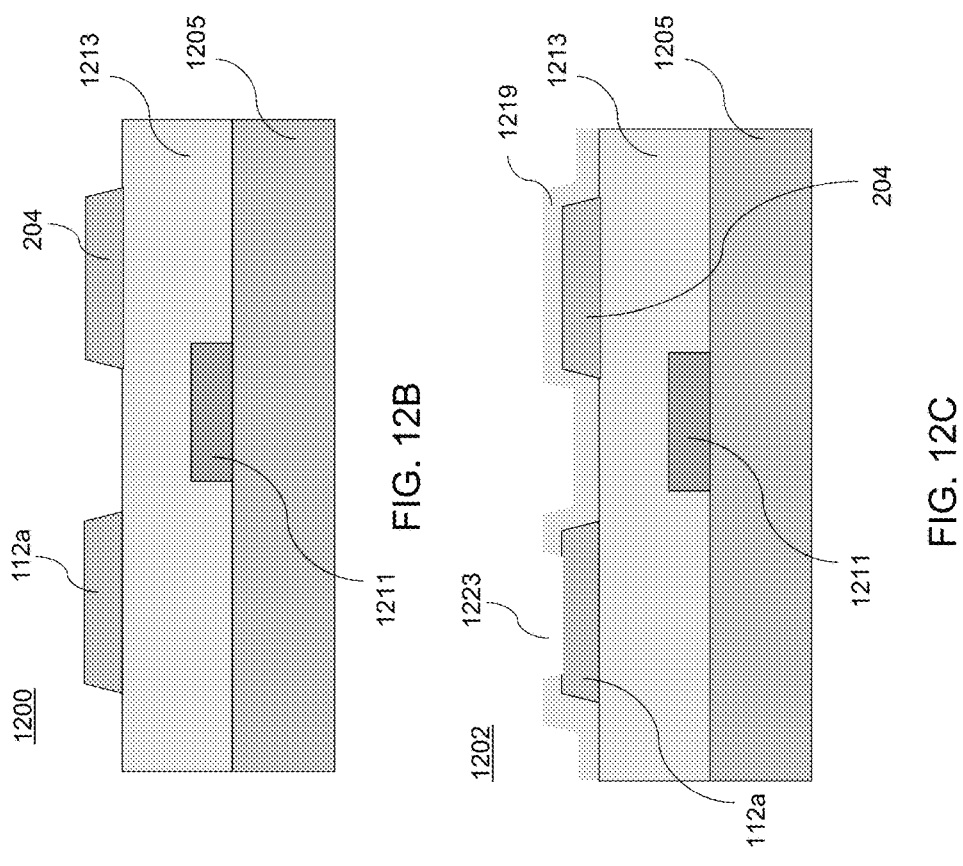
FIG. 12B
FIG. 12C
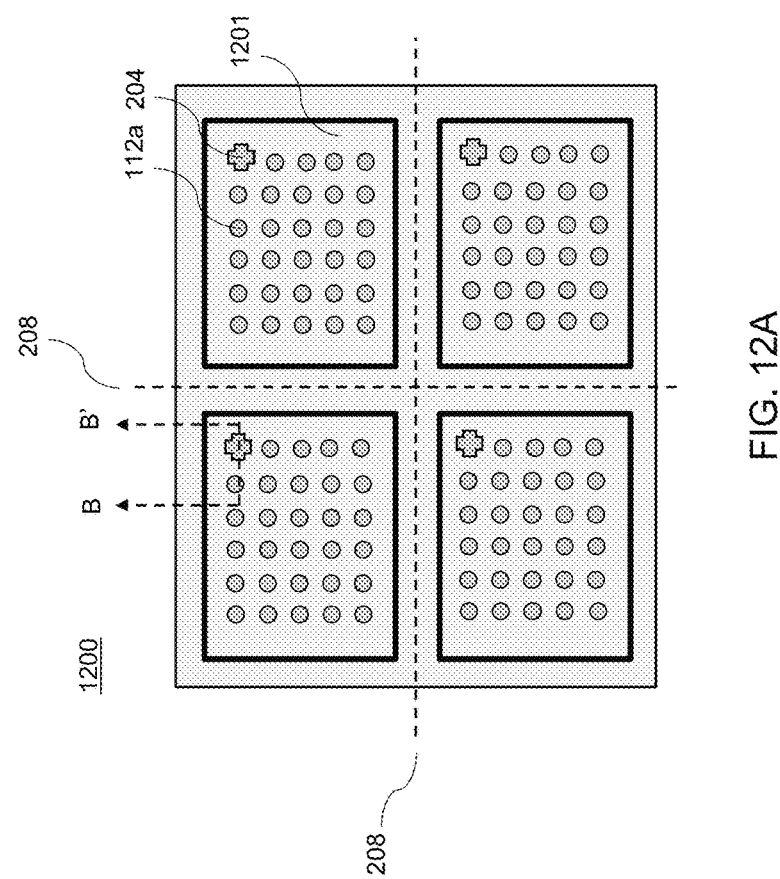
FIG. 12A

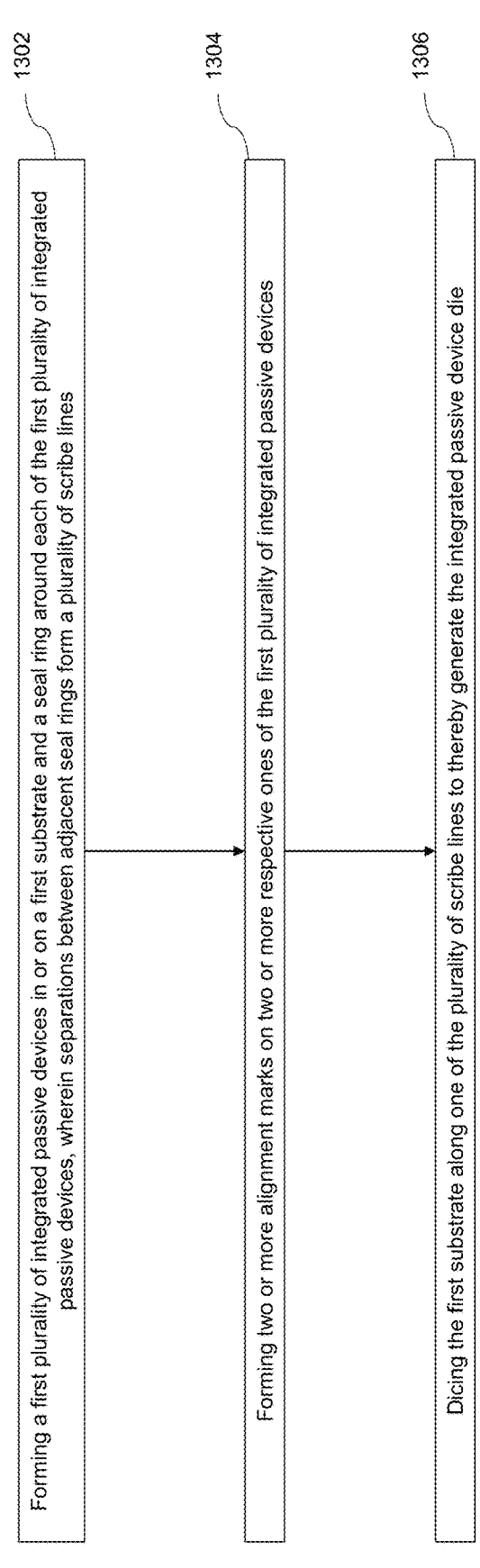

1302

Forming a first plurality of integrated passive devices in or on a first substrate and a seal ring around each of the first plurality of integrated passive devices, wherein separations between adjacent seal rings form a plurality of scribe lines

1304

Forming two or more alignment marks on two or more respective ones of the first plurality of integrated passive devices

1306

Dicing the first substrate along one of the plurality of scribe lines to thereby generate the integrated passive device die

INTEGRATED PASSIVE DEVICE DIES AND METHODS OF FORMING AND PLACEMENT OF THE SAME

BACKGROUND

In addition to smaller electronic components, improvements to the packaging of components have been developed in an effort to provide smaller packages that occupy less area than previous packages. Example approaches include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12A is a bottom-up view of an intermediate structure used in the formation of an integrated circuit die having alignment marks, according to various embodiments.

FIG. 12B is a vertical cross-sectional view of the intermediate structure of FIG. 12A, according to an embodiment.

FIG. 12C is a vertical cross-sectional view of a further intermediate structure generated by forming a passivation layer over the intermediate structure of FIG. 12B, according to an embodiment.

FIG. 13 is a flowchart illustrating operations of a method of fabricating an integrated passive device die, according to various embodiments.

DETAILED DESCRIPTION

Figure 1A:
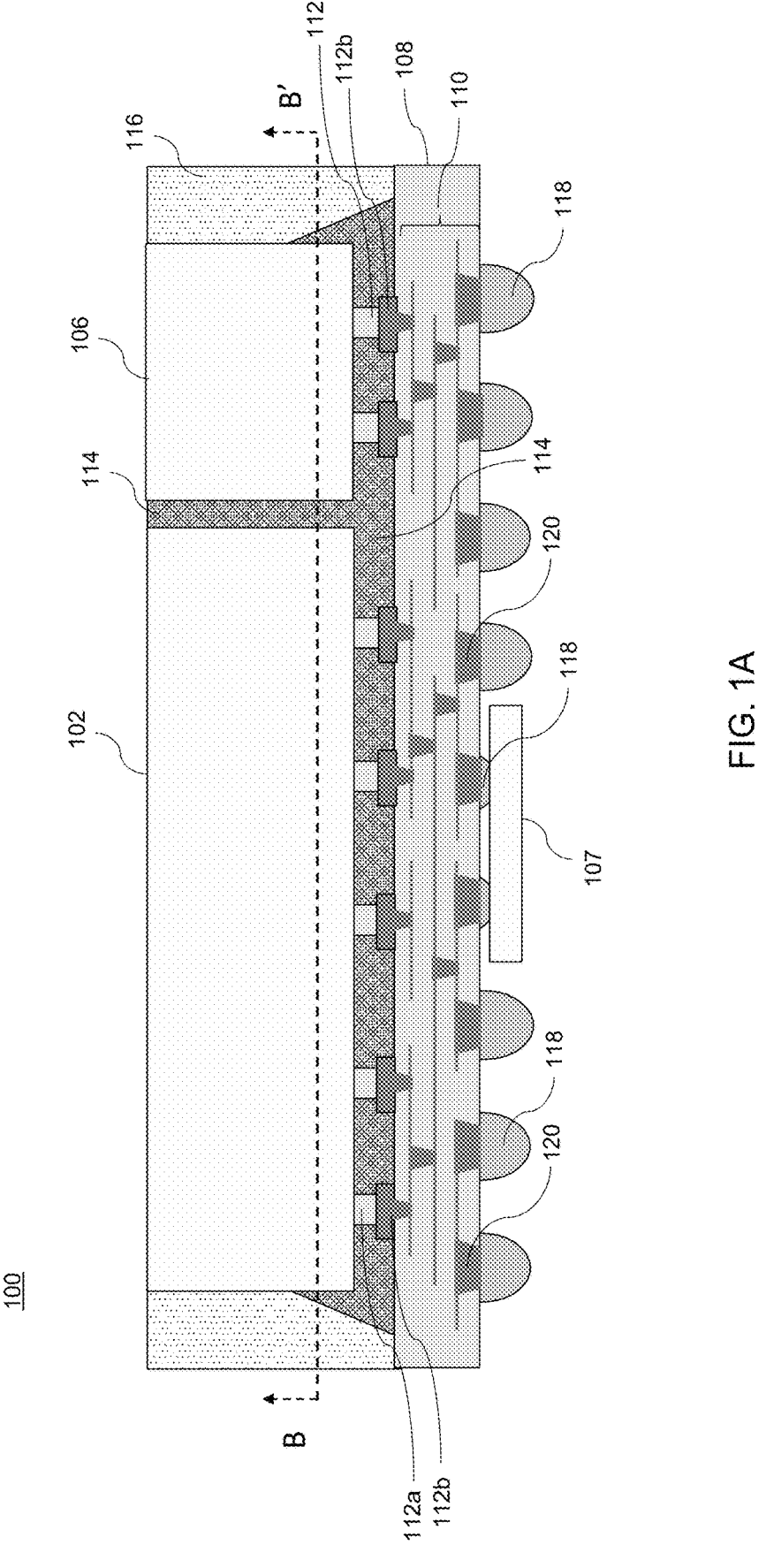
FIG. 1A is a vertical cross-sectional view of a semiconductor device including semiconductor dies and an integrated passive device die attached to an interposer, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Generally, existing integrated passive device dies have a fixed size and electrical properties. Thus, circuit designs may be limited by existing integrated passive device dies. Various embodiments are disclosed herein that provide integrated passive device dies, and methods of forming the same, that have advantages over existing integrated passive device dies. Various embodiments disclosed herein may provide integrated passive device dies that may be chosen to have a plurality of integrated passive devices. Further, the number of integrated passive devices may be chosen by the way in which the semiconductor wafer upon which the integrated passive devices are formed is diced. As such, a plurality of different types of integrated passive device dies, having different sizes and numbers of integrated passive devices, may be generated. As such, in various embodiments, structures and methods disclosed herein may provide for greater flexibility in the design and fabrication of integrated passive device dies relative to existing approaches.

An embodiment semiconductor device may include an interposer, a semiconductor die electrically connected to the interposer, an integrated passive device die electrically connected to the interposer, the integrated passive device die including two or more seal rings, and a first alignment mark formed on the integrated passive device die within a first area enclosed by a first one of the two or more seal rings. The integrated passive device die may further include two or more integrated passive devices located within respective areas enclosed by respective ones of the two or more seal rings. Each of the two or more integrated passive devices may include electrical connections that are formed as a plurality of micro-bumps, the first alignment mark may be electrically isolated from the electrical connections, and the first alignment mark and the electrical connections may share a common material.

In a further embodiment, a system including integrated passive devices may include a first substrate and a first plurality of integrated passive devices formed in or on the first substrate. Each of the first plurality of integrated passive devices may include a seal ring, two or more alignment marks formed on two or more respective ones of the first plurality of integrated passive devices, and a plurality of scribe lines formed on the first substrate such that the first substrate may be diced along one or more of the plurality of scribe lines to thereby generate an integrated passive device die. As such, the integrated passive device die, so generated, may include a second substrate having a second plurality of integrated passive devices such that the second substrate is a portion of the first substrate and the second plurality of integrated passive devices is a subset of the first plurality of integrated passive devices.

An embodiment method of fabricating an integrated passive device die may include forming a first plurality of integrated passive devices in or on a first substrate and a seal ring around each of the first plurality of integrated passive devices, such that separations between adjacent seal rings form a plurality of scribe lines. The method may further include forming two or more alignment marks on two or more respective ones of the first plurality of integrated passive devices. The plurality of scribe lines may be formed such that the first substrate may be diced along one or more of the plurality of scribe lines to thereby generate the integrated passive device die. A distance between two of the two or more alignment marks may correspond to a size of the integrated passive device die generated by dicing the first substrate to generate the integrated passive device die.

Figure 1B:
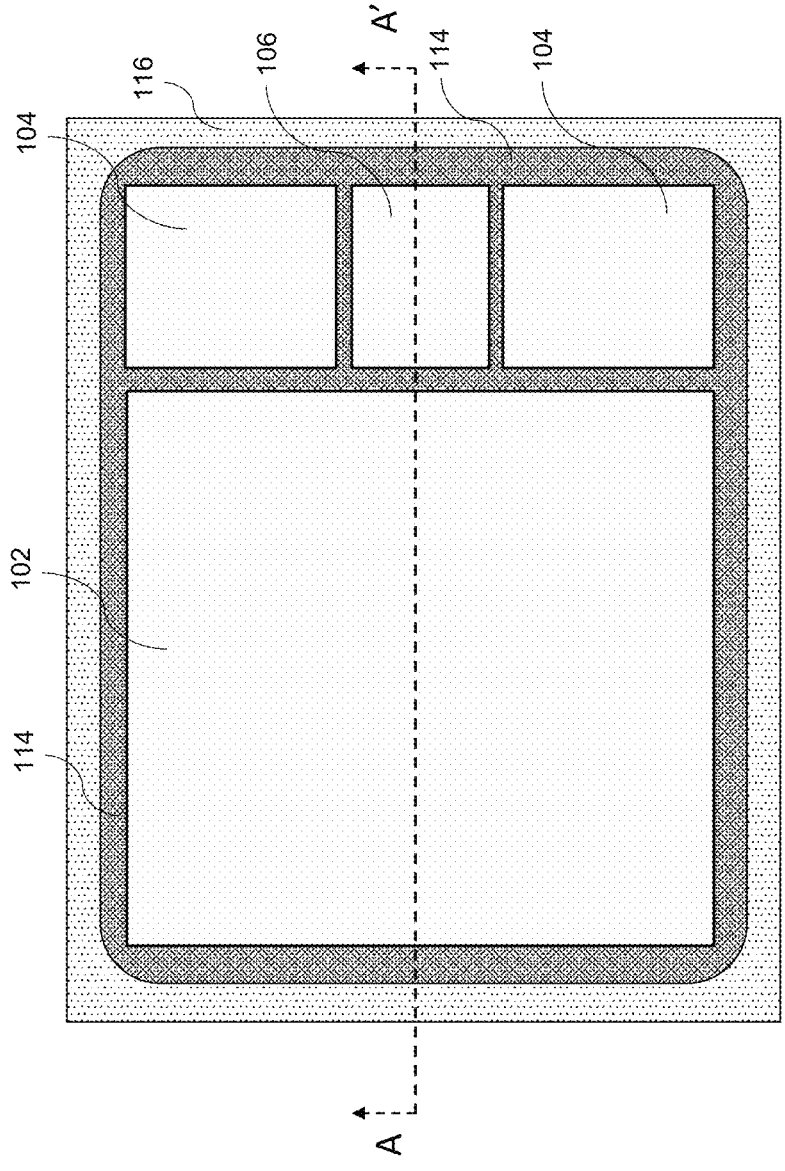
FIG. 1B is a horizontal cross-sectional view of the semiconductor device of FIG. 1, according to various embodiments.

FIG. 1A is a vertical cross-sectional view of a semiconductor device 100 including semiconductor dies (102 and 104 shown in FIG. 1B) and integrated passive device dies (106, 107) electrically connected to an interposer 108, and FIG. 1B is a horizontal cross-sectional view of the semiconductor device 100 of FIG. 1, according to various embodiments. The cross-sectional view of FIG. 1A corresponds to a vertical plane indicated by the cross-section A-A' in FIG. 1B, and the cross-sectional view of FIG. 1B corresponds to a horizontal plane indicated by the cross-section B-B' in FIG. 1A. As shown, in FIGS. 1A and 1B, the semiconductor device 100 may include a first semiconductor die 102, two second semiconductor dies 104, and one or more integrated passive device dies (106, 107). According to an embodiment, the first semiconductor die 102 may be a system-on-chip (SoC) die and the second semiconductor dies 104 may each be high-bandwidth memory (HBM) dies. In other embodiments, the first semiconductor die 102 and the two second semiconductor dies 104 may be various other types of dies that may be configured to provide various functionalities.

As shown, in FIG. 1A, a first integrated passive device die 106 may be attached to a first side of the interposer 108 along with the first semiconductor die 102 and the two second semiconductor dies 104. In other embodiments, a second integrated passive device die 107 may be attached to a second side of the interposer 108 opposite the first semiconductor die 102 and the two second semiconductor dies 104. As shown, in FIG. 1A, some embodiments may include both the first integrated passive device die 106 and the second integrated passive device die 107. However, other embodiments (not shown) may include only one of the first integrated passive device die 106 and the second integrated passive device die 107.

The interposer 108 may be an organic interposer, a silicon interposer, a glass interposer, etc., having a redistribution interconnect structure 110. The first semiconductor die 102, the second semiconductor dies 104, and the integrated passive device dies (106, 107) may each be electrically coupled to the interposer 108 via a plurality of solder portions (e.g., first solder portions 118) that connect respective bonding pads or micro-bumps of the respective semiconductor and integrated passive device dies (102, 104, 106, 107) and the interposer 108. For example, the first semiconductor die 102 and the first integrated passive device die 106 may each include first bonding pads 112a that may be configured to be attached to respective second bonding pads 112b of the interposer 108, as shown in FIG. 1A. The second semiconductor die 104 may include similar first bonding pads (not shown). As such, the second semiconductor die 104 may similarly be electrically coupled to the interposer 108 via a plurality of solder portions (not shown) that connect respective bonding pads or micro-bumps (not shown) of the respective second semiconductor die 104 and the interposer 108.

At least one underfill material portion 114 may be formed around the first bonding pads 112a and second bonding pads 112b. The underfill material portion 114 may be formed by injecting an underfill material around the first bonding pads 112a and second bonding pads 112b after solder material portions (not shown) are reflowed. Various underfill material application methods may be used, which may include, for example, a capillary underfill method, a molded underfill method, or a printed underfill method. In this example embodiment, the respective semiconductor and integrated passive device dies (102, 104, 106) may be attached to the interposer 108 and a single underfill material portion 114 may continuously extend underneath first semiconductor die 102, the second semiconductor dies 104, and the first integrated passive device die 106, as shown in FIGS. 1A and 1B.

An epoxy molding compound (EMC) may be applied to gaps formed between the interposer 108 and the respective dies (102, 104, 106) to thereby form an EMC frame 116. The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC may provide better handling, good flowability, fewer voids, better fill, and fewer flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks and may enhance flowability.

The EMC may be cured at a curing temperature to form an EMC matrix that laterally encloses each of the respective dies (102, 104, 106). The curing temperature of the EMC may be in a range from 125° C. to 150° C. The EMC frame 116 may laterally surround and embed the respective dies (102, 104, 106). Excess portions of the EMC frame 116 may be removed from above the horizontal plane including the top surfaces of the respective dies (102, 104, 106) by a planarization process, which may use chemical mechanical planarization. In other embodiments, a similar EMC matrix (not shown) may be formed between a top surface of the second integrated passive device die 107 and a bottom surface of the interposer 108.

The semiconductor device 100, including the first semiconductor die 102, the second semiconductor dies 104, the first integrated passive device die 106, and the interposer 108, may further be coupled to a substrate (not shown) by the first solder portions 118 that may couple bonding pads 120 (or bump structures) of the interposer 108 and the substrate. The substrate may further be electrically coupled to another structure such as a printed circuit board PCB (not shown) via respective bonding pads (or bump structures) of the substrate and PCB. The integrated passive device die 106 may be configured in various ways, as described with reference to FIGS. 2A and 2B, below.

Figures 2A, 2B:
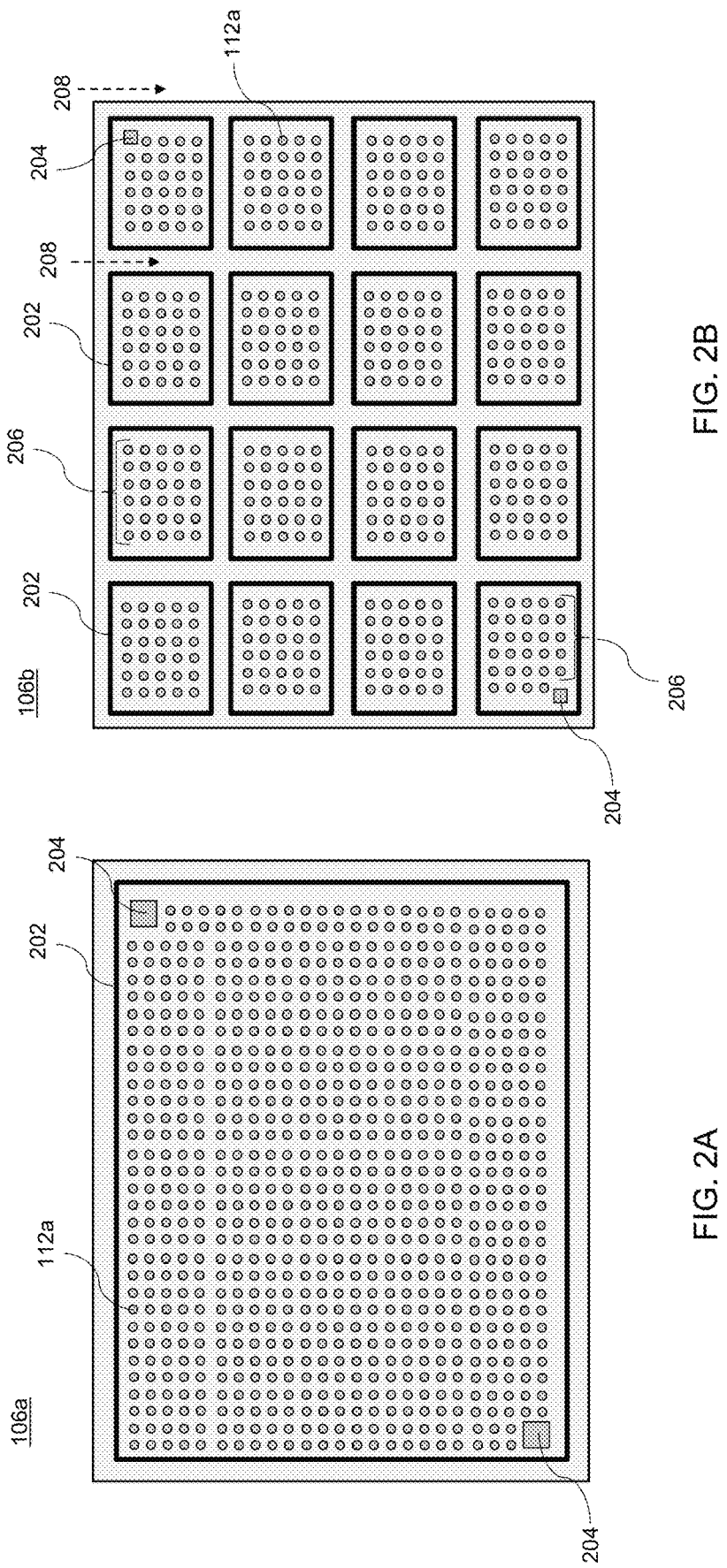
FIG. 2A is a bottom-up view of an integrated passive device die having a seal ring, according to various embodiments.
FIG. 2B is a bottom-up view of an integrated passive device die having a plurality of seal rings, according to various embodiments.

FIG. 2A is a bottom view of an integrated passive device die 106a having a seal ring 202, according to various embodiments. The seal ring 202 may be formed within the integrated passive device die 106a and may provide structural stability to the integrated passive device die 106a. As described in greater detail with reference to FIGS. 4A to 4C, below, a plurality of integrated passive devices 206 may be formed on a substrate (e.g., on a semiconductor wafer 414) and the substrate may be diced (i.e., singulated) to form a plurality of integrated passive device dies 106a. The presence of the seal ring 202 may provide protection to the integrated passive device dies 106a during the dicing process.

As shown in FIG. 2A, the integrated passive device die 106a may include a plurality of first bonding pads 112a that may be formed as bonding pads or micro-bumps. The first bonding pads 112a may be configured to provide electrical pathways to circuit elements formed within the integrated passive device die 106a such as inductors, capacitors, resistors, diodes, etc. The integrated passive device die 106a may further include one or more alignment marks 204 that may be used to properly position the integrated passive device die 106a during the process of attaching the integrated passive device die 106a to the interposer 108. As described in greater detail with reference to FIGS. 12A to 12C, below, the alignment marks 204 may be formed using the same process that is used to form the electrical connections (e.g., first bonding pads 112a). In this regard, the alignment marks 204 and the electrical connections (e.g., first bonding pads 112a) may share a common material but the alignment marks 204 may be configured to be electrically isolated from the first bonding pads 112a.

FIG. 2B is a bottom view of an integrated passive device die 106b having a plurality of seal rings 202, according to various embodiments. In some example embodiments, it may be advantageous to include two or more seal rings 202 within the integrated passive device die 106b. In this regard, the various circuit elements of the integrated passive device die 106b of FIG. 2A may be simplified by localizing such circuit elements within a plurality of respective areas that may each be enclosed by a respective one of the seal rings 202. As such, certain electrical interconnects within the integrated passive device die 106b may be configured to be shorter than corresponding electrical interconnects within the integrated passive device die 106a of FIG. 2A. The example embodiment integrated passive device die 106b of FIG. 2B may include a plurality of integrated passive devices 206 located within respective areas enclosed by respective seal rings 202. As shown, the integrated passive device die 106b may further include one or more alignment marks 204 that may be formed in respective integrated passive devices 206.

The process of forming an integrated passive device die 106b may be simplified by forming a plurality of integrated passive devices 206 on a wafer and dicing/singulating the wafer to form integrated passive device dies 106b having user-selectable sizes. For example, the integrated passive device die 106b, of FIG. 2B, may include sixteen integrated passive devices 206 that are each located within an area bounded by a respective seal ring 202. Various different integrated passive device dies may be formed by dicing/singulating the wafer in different sizes, as described in greater detail with reference to FIGS. 4A to 4C, 7, 9, 10, and 11, below. For example, a plurality of scribe lines 208 may be provided, with each scribe line 208 located in a space between adjacent integrated passive devices 206. Thus, various user-selectable sized integrated passive device dies 106b may be generated by dicing the wafer in different ways along the various scribe lines 208. Each scribe line 208 may be a physical mark (not shown) formed on the integrated passive device die 106b. Alternatively, a scribe line 208 may correspond to a space between adjacent seal rings 202 without any additional marks associated with the scribe line 208.

Figure 3:
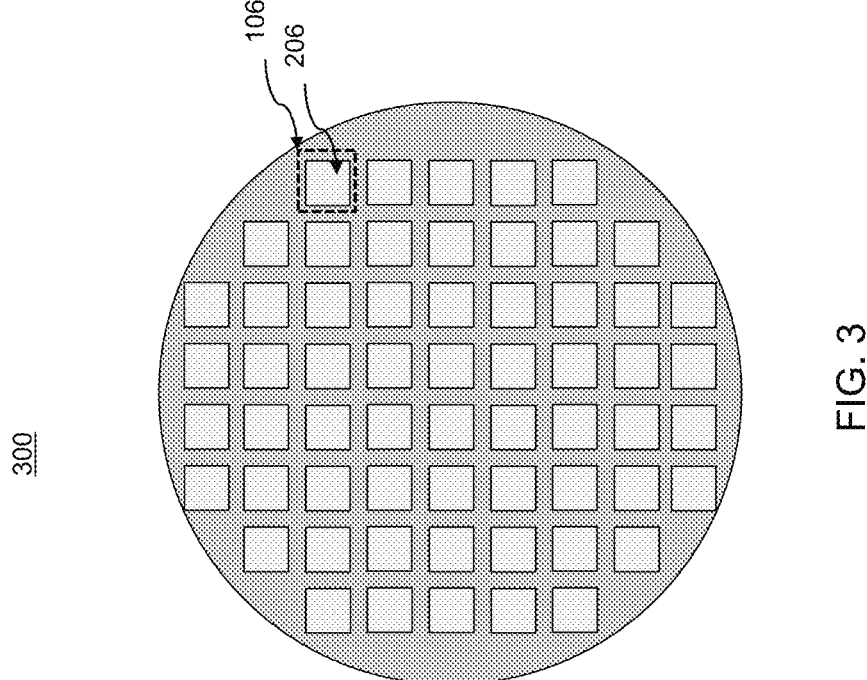
FIG. 3 is a plan view of a semiconductor wafer having a plurality of integrated passive devices formed thereon, according to various embodiments.

FIG. 3 is a plan view of a semiconductor wafer 300 having a plurality of integrated passive devices 206 formed thereon, according to various embodiments. The integrated passive devices 206 may include various passive devices such as capacitors, inductors, resistors, diodes, antennas, or any other passive electrical component, or combination of passive elements. The semiconductor wafer 300 may be diced along the dashed lines to generate a plurality of integrated passive device dies 106, each containing a single integrated passive device 206. Such integrated passive device dies 106 may then be incorporated into other device structures. For example, one or more integrated passive device dies (106,

107) may be incorporated into a semiconductor device structure such as the semiconductor device 100 described above with reference to FIG. 1. For example, integrated passive device dies (106, 107) may be coupled to an interposer 108. Alternatively, integrated passive device dies 106 may be formed as part of an interposer core structure (not shown). Various device structures may be formed by coupling integrated passive device dies 106 with organic interposers, with silicon interposers, glass interposer, or with combinations of various types of interposers.

Each integrated passive device die 106 may have certain electrical properties. For example, the integrated passive device dies 106 may have a capacitance C, in instances in which the integrated passive device dies 106 include a capacitor structure. Alternatively, the integrated passive device dies 106 may have an inductance L or a resistance R, in instances in which the integrated passive device dies 106 include inductors or resistors, respectively. A plurality of integrated passive device dies 106 may be incorporated into a semiconductor device package structure, such as the semiconductor device 100 of FIG. 1. As such, the various integrated passive device dies 106 may be wired in series or in parallel as needed to provide desired electrical properties for a given structure.

For certain device structures, however, it may be inconvenient to include a plurality of individual integrated passive device dies 106. In this regard, the physical size and fixed electrical properties of integrated passive device dies 106 may constrain the possibilities for circuit design. In certain applications it may be more convenient to have an integrated passive device die 106 that has a plurality of integrated passive devices 206 on a given integrated passive device die 106, as described in greater detail with reference to FIGS. 4A and 4B, below.

Figures 4A, 4B:
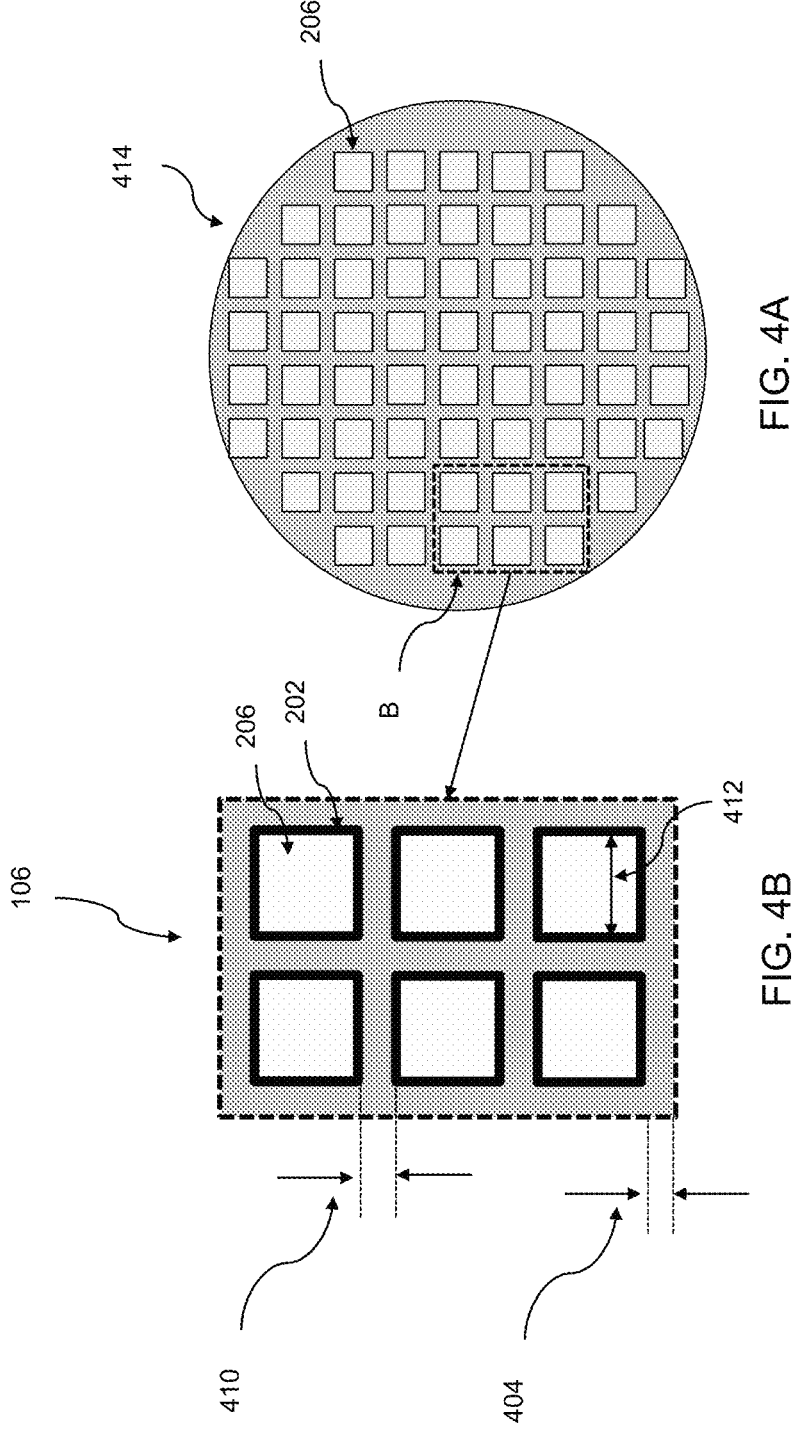
FIG. 4A is a plan view of a further semiconductor wafer having a plurality of integrated passive devices formed thereon, according to various embodiments.
FIG. 4B is a plan view of a portion of the semiconductor wafer of FIG. 4A, according to various embodiments.

FIG. 4A is a plan view of a further semiconductor wafer 414 having a plurality of integrated passive devices 206 formed thereon, and FIG. 4B is a plan view of a portion of the semiconductor wafer 414 of FIG. 4A, according to various embodiments. In contrast to the semiconductor wafer 300 of FIG. 3, the semiconductor wafer 414 may be constructed such that it may be diced in various ways. For example, an integrated passive device die 106 having six integrated passive devices 206 (e.g., see FIG. 4B) may be generated by dicing the semiconductor wafer 414 along the dashed lines (forming rectangle B) indicated in FIG. 4A.

Alternatively, the semiconductor wafer 414 may be diced in other ways to generate an integrated passive device die 106 having various numbers of integrated passive devices 206. For example, the semiconductor wafer may be diced to have a single integrated passive device 206, as described above with reference to FIG. 3. The semiconductor wafer 414 may also be diced to generate an integrated passive device die 106 having two, four, eight, etc., integrated passive devices 206. In this regard, the semiconductor wafer 414 may be diced to generate an integrated passive device die 106 having any number of integrated passive devices 206. In such embodiments, a size of the resulting integrated passive device die 106 may be a multiple of an area associated with each integrated passive device.

Each integrated passive device 206 may be formed with a seal ring 202 that may be configured to protect each integrated passive device 206 during the process of dicing the semiconductor wafer 414. Each seal ring 202 may extend around a periphery of each respective integrated passive device 206. The seal ring 202 may be further configured to protect the integrated passive device 206 from contaminant diffusion and/or physical damage during device processing, such as plasma etching and/or deposition processes.

The seal ring 202 may include copper at an atomic percentage greater than 80%, such as greater than 90% and/or greater than 95% although larger or smaller percentages may be used. The seal ring 202 may include conductive lines and via structures that may be connected to each other, or the seal ring 202 may be electrically isolated from other structures in the semiconductor wafer 414. In some embodiments, the seal ring 202 may be formed by a dual-Damascene process or by multiple single Damascene processes. Single-Damascene processes generally form and fill a single feature with copper per a Damascene stage. Dual-Damascene processes generally form and fill two features with copper at once. For example, a trench and overlapping through-hole may both be filled with a single copper deposition using dual-Damascene processes. In alternative embodiments, the seal ring 202 may be formed by an electroplating process.

As shown in FIG. 4B, each seal ring 202 may be configured to have a rectangular shape. In some embodiments, the seal ring may have a have a width 412 that is in a range from approximately 1 mm to approximately 3 mm. As such, each integrated passive device 206, having a seal ring 202, may have an associated area, such that an area of an integrated passive device die 106 is a multiple of each the area associated with each integrated passive device 206 and seal ring 202. The area associated with each integrated passive device 206 and seal ring 202 may be chosen such that a predetermined distance 404 is formed at edges of the integrated passive device die 106, as shown in FIG. 4B. In this regard, when the semiconductor wafer 414 is diced to generate an integrated passive device die 106, the predetermined distance 404 may be approximately half of a distance 410 between neighboring seal rings 202 associated with respective integrated passive devices 206, as described in greater detail with reference to FIG. 4C, below.

Figure 4C:
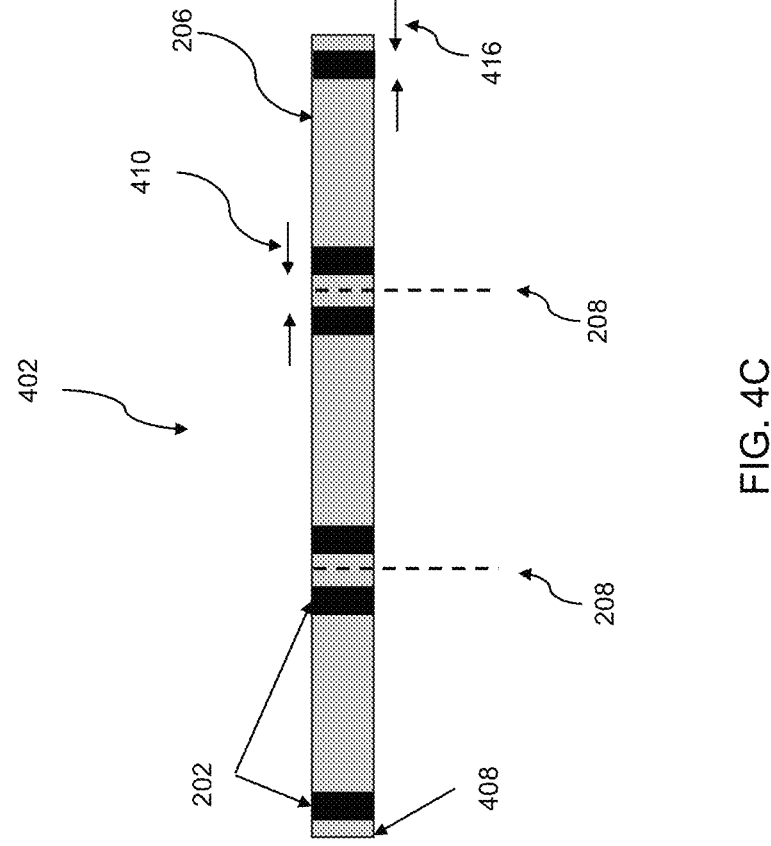
FIG. 4C is an edge view of a portion of the semiconductor wafer of FIG. 4A, according to various embodiments.

FIG. 4C is an edge view of a portion 402 of the semiconductor wafer of FIG. 4A, according to various embodiments. As shown in FIG. 4C, each structure including the integrated passive device 206 and seal ring 202 may be separated by scribe lines 208. The scribe lines 208 may be provided between each neighboring integrated passive device 206 and seal ring 202 formed on the semiconductor wafer 414. The scribe lines 208 allow the semiconductor wafer 414 to be diced in various ways to thereby generate integrated passive device dies 106 having various numbers of integrated passive devices 206. As such, the scribe lines 208 may thereby divide an area of the semiconductor wafer 414 into a plurality of unit cells B, with each unit cell B including at least one integrated passive device 206 and at least one seal ring 202. As mentioned above, each scribe line 208 may be a physical mark formed on the integrated passive device die 106b. Alternatively, a scribe line 208 may correspond to a space between adjacent seal rings 202 without any additional marks associated with the scribe line 208.

As shown in FIG. 4C, an area of each unit cell may be chosen such that adjacent seal rings 202 are separated by a distance 410. Dicing the semiconductor wafer 414 (e.g., see FIG. 4A) along scribe lines 208 (e.g., see FIG. 4C) thereby divides the distance 410 leaving the predetermined distance 404 (e.g., see FIG. 4B) between an edge 408 of the resulting integrated passive device die 106 and seal rings 202 adjacent to the edge 408 of the integrated passive device die 106, as described above with reference to FIG. 4B. According to an embodiment, the distance 410 may be in a range from approximately 80 microns to approximately 500 microns. Further, each seal ring may have a thickness 416 that is in a range from approximately 5 microns to approximately 30 microns.

Figure 5A:
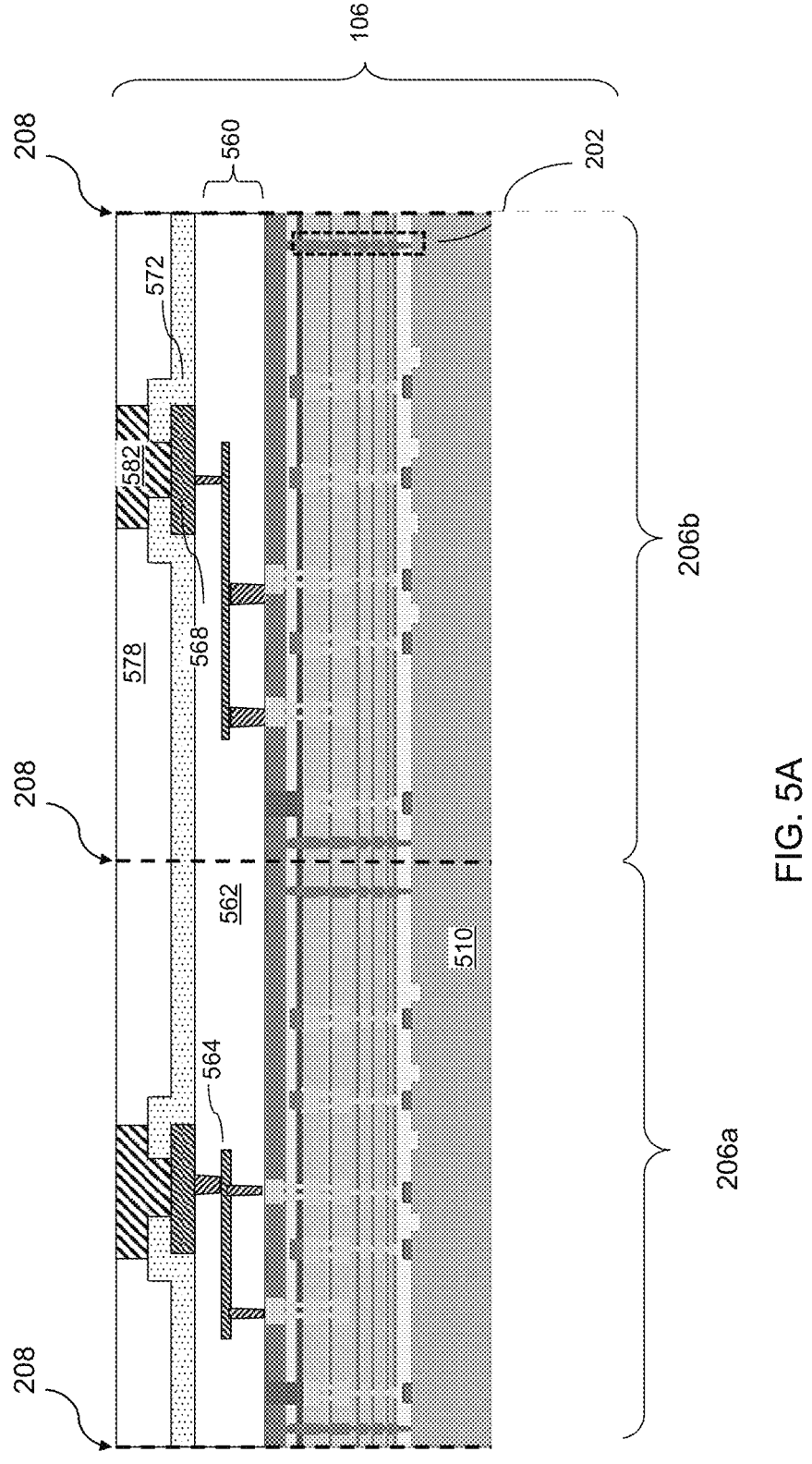
FIG. 5A is a vertical cross-sectional view of an integrated passive device die, according to various embodiments.

FIG. 5A is a vertical cross-sectional view of an integrated passive device die 106, according to various embodiments. The integrated passive device die 106 may include any passive device that may be formed within, or on, a semiconductor substrate 510 such as a silicon substrate, a dielectric substrate, or a metallic substrate. For example, the integrated passive device die 106 may include at least one capacitor, at least one inductor, at least one resistor, at least one diode, at least one antenna, or any other passive electrical component. In this example, the integrated passive device die 106 may include a first integrated passive device 206a and a second integrated passive device 206b. Each of the first integrated passive device 206a and the second integrated passive device 206b may include a seal ring 202.

The configuration of FIG. 5A is only illustrative, and other embodiments may include any other configuration for capacitors or for any other integrated passive device. The semiconductor substrate 510 may be provided as a portion of a silicon wafer having a plurality of integrated passive devices (206a, 206b, etc.) formed thereon. In other words, a two-dimensional array of integrated passive devices (206a, 206b, etc.) each including respective passive electrical circuits may be formed, and may be subsequently diced, along scribe lines 208, to provide a semiconductor substrate 510 having one or more integrated passive devices (206a, 206b, etc.).

An interconnect-level structure 560 including interconnect-level dielectric layers 562 and metal interconnect structures 564 may be formed on the front-side surface of the silicon wafer prior to dicing. The interconnect-level dielectric layers 562 may include a respective dielectric material layer such as silicon oxide, organosilicate glass, silicon nitride, or any other dielectric material that may be used as interconnect-level insulating layers. The metal interconnect structures 564 may include metal lines and metal via structures. For example, a thickness of each metal line and the thickness of each metal via may be in a range from approximately 100 nm to approximately 1,000 nm, such as from approximately 150 nm to approximately 600 nm, although other embodiments may include smaller or larger thicknesses. The metal interconnect structures 564 may include copper, aluminum, tungsten, molybdenum, ruthenium, or other transition metals that may be formed as patterned structures. Other suitable materials may be within the contemplated scope of disclosure.

A total number of metal line levels in the interconnect-level structure 560 may be in a range from 1 to 8, such as from 2 to 4, although smaller and larger numbers of metal line levels may also be used. Metal pad structures 568 may be formed at the topmost level of the interconnect-level structure 560. A passivation dielectric layer 572 such as a silicon nitride layer may be deposited over the metal pad structures 568. The thickness of the passivation dielectric layer 572 may be in a range from approximately 30 nm to approximately 100 nm. Metal bonding structures 582 may be formed on each metal pad structure 568. The metal bonding structures 582 may be configured for C4 (controlled collapse chip connection) bonding or may be configured for C2 bonding. The metal bonding structures 582 may be optionally embedded within a further dielectric 578. The semiconductor wafer with the interconnect-level structure 560 may be subsequently diced, along scribe lines 208, to provide a plurality of integrated passive device dies 106

(e.g., see FIG. 4B). At least one of the integrated passive device dies 106 may be optionally subsequently incorporated into a semiconductor device structure (e.g., semiconductor device 100 of FIG. 1) including an interposer 108, according to various embodiments.

Figure 5B:
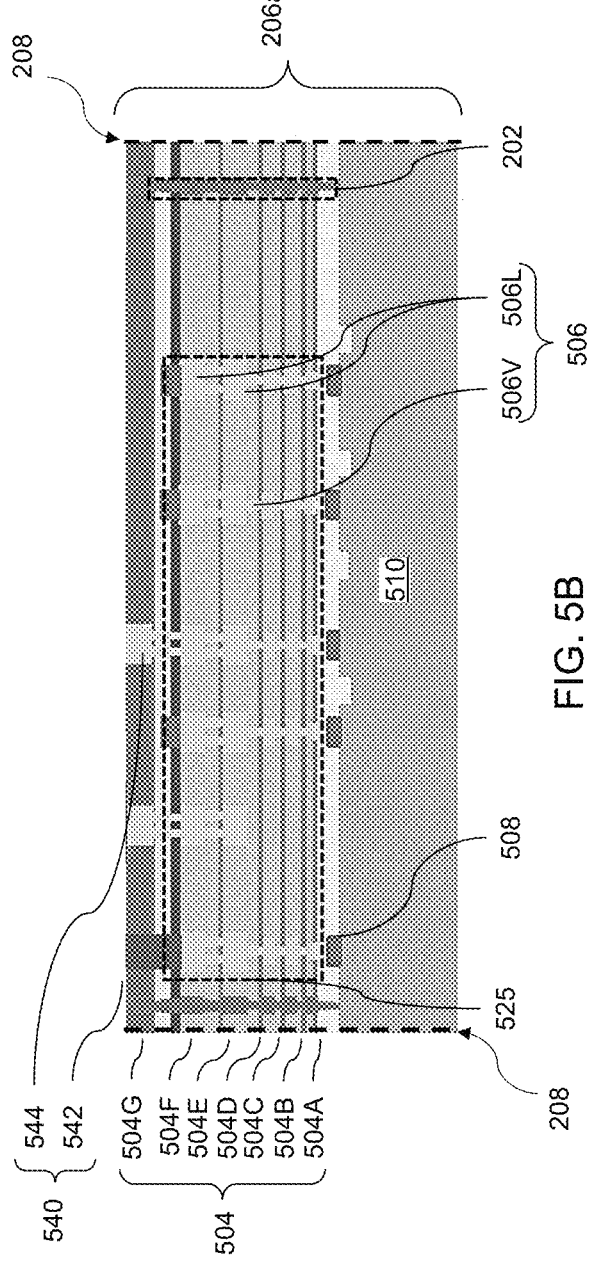
FIG. 5B is a vertical cross-sectional view of the first integrated passive device 206a of FIGS. 5A, according to various embodiments.

FIG. 5B is a vertical cross-sectional view of the first integrated passive device 206a of FIGS. 5A, according to various embodiments. As described above, the first integrated passive device 206a may include passive electrical circuit components. In other embodiments, various other types of electrical circuits may be formed on a semiconductor wafer 414 (e.g., see FIG. 4A) and may be diced into dies having various other sizes, as described above with reference to FIGS. 4A to 4C for integrated passive devices 206. For example, various other circuit dies may include an application-specific integrated circuit (ASIC) chip, an analog chip, a sensor chip, a wireless and radio frequency chip, a voltage regulator chip, an antenna, a memory chip, etc.

As shown in FIG. 5B, first integrated passive device 206a may include the semiconductor substrate 510, a dielectric structure 504, electrically conducting features 506 embedded within the dielectric structure 504, a seal ring 202, and a bonding structure 540. In some embodiments, the semiconductor substrate 510 may include an elementary semiconductor such as silicon or germanium and/or a compound semiconductor such as silicon germanium, silicon carbide, gallium arsenic, indium arsenide, gallium nitride or indium phosphide. In some embodiments, the semiconductor substrate 510 may be a semiconductor-on-insulator (SOI) substrate. In various embodiments, the semiconductor substrate 510 may take the form of a planar substrate, a substrate with multiple fins, nanowires, or other forms known to persons of ordinary skill in the art. Depending on the requirements of design, the semiconductor substrate 510 may be a p-type substrate or an n-type substrate and may have doped regions therein. The doped regions may be configured for an n-type device or a p-type device.

In some embodiments, the semiconductor substrate 510 may include isolation structures defining at least one active area, and a device layer may be disposed on/in the active area. The device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the device layer may include a gate structure, source/drain regions, spacers, and the like.

The dielectric structure 504 may be disposed on a front side of the semiconductor substrate 510. In some embodiments, the dielectric structure 504 may include silicon oxide, silicon oxynitride, silicon nitride, a low dielectric constant (low-k) material, or a combination thereof. The dielectric structure 504 may be a single layer or a multiple-layer dielectric structure. For example, as shown in FIG. 5B, the dielectric structure 504 may include multiple dielectric layers, such as a substrate planarization dielectric layer 504A, inter-layer dielectric layers 504B-504F, and an interconnect planarization layer 504G. However, while FIG. 5B illustrates seven dielectric layers, the various embodiments of the present disclosure are not limited to any particular number of layers, more or fewer layers may be used.

The dielectric structure 504 may be formed by any suitable deposition process. Herein, "suitable deposition processes" may include a chemical vapor deposition (CVD) process, a physical vapor deposition (PVD) process, an atomic layer deposition (ALD) process, a high-density plasma CVD (HDPCVD) process, a metalorganic CVD (MOCVD) process, a plasma enhanced CVD (PECVD) process, a sputtering process, laser ablation, etc.

An interconnect structure 525 may be formed in the dielectric structure 504. The interconnect structure 525 may include electrically conducting features 506 disposed in the dielectric structure 504. The electrically conducting features 506 may be any of a variety of via structures 506V and electrically conductive lines 506L. The electrically conducting features 506 may be formed of any suitable electrically conductive material, such as tungsten (W), copper (Cu), a copper alloy, aluminum (Al), an aluminum alloy, combinations thereof, etc. In some embodiments, barrier layers (not shown) may be disposed between the electrically conducting features 506 and the dielectric layers of dielectric structure 504, to prevent the material of the electrically conducting features 506 from migrating to the semiconductor substrate 510. The barrier layer may include Ta, TaN, Ti, TiN, CoW, or combinations thereof, for example. Other suitable barrier layer materials are within the contemplated scope of disclosure.

The electrically conducting features 506 may include electrically conductive lines 506L and via structures 506V. The via structures 506V may operate to electrically connect electrically conductive lines 506L disposed in adjacent inter-layer dielectric layers 504B-504F. The electrically conducting features 506 may be electrically connected to first bonding pads 508 disposed on the semiconductor substrate 510, such that the interconnect structure 525 may electrically connect semiconductor devices formed on the semiconductor substrate 510 to various pads and nodes.

The seal ring 202 may extend around the periphery of the first integrated passive device 206a. For example, the seal ring 202 may be disposed in the dielectric structure 504 and may laterally surround the interconnect structure 525. The seal ring 202 may be configured to protect the interconnect structure 525 from contaminant diffusion and/or physical damage during device processing, such as plasma etching and/or deposition processes.

The seal ring 202 may include copper at an atomic percentage greater than 80%, such as greater than 90% and/or greater than 95% although greater or lesser percentages may be used. The seal ring 202 may include conductive lines and via structures that may be connected to each other and may be formed simultaneously with the electrically conductive lines 506L and via structures 506V of the electrically conducting features 506 of the interconnect structure 525. The seal ring 202 may be electrically isolated from the electrically conducting features 506.

In some embodiments, the electrically conducting features 506 and/or the seal ring 202 may be formed by a dual-Damascene process or by multiple single Damascene processes. Single-Damascene processes generally form and fill a single feature with copper per Damascene stage. Dual-Damascene processes generally form and fill two features with copper at once, for example, a trench and overlapping through-hole may both be filled with a single copper deposition using dual-Damascene processes. In alternative embodiments, the electrically conducting features 506 and/or the seal ring 202 may be formed by an electro-plating process.

For example, the Damascene processes may include patterning the dielectric structure 504 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the dielectric structure 504.

The patterning, metal deposition, and planarizing processes may be performed for each of the dielectric layers 504A-504G, to thereby form the interconnect structure 525 and/or the seal ring 202. For example, the substrate planarization dielectric layer 504A may be deposited and patterned to form openings. A deposition process may then be performed to fill the openings in the substrate planarization dielectric layer 504A. A planarization process may then be performed to remove the overburden and to form electrically conducting features 506 in the substrate planarization dielectric layer 504A. These process steps may be repeated to form the inter-layer dielectric layers 504B-504F and the corresponding electrically conducting features 506, and thereby complete the interconnect structure 525 and/or seal ring 202.

The first integrated passive device 206a may include a bonding structure 540 disposed over the dielectric structure 504. The bonding structure 540 may include a dielectric bonding layer 542 and one or more bonding features 544. The dielectric bonding layer 542 may be formed by depositing a dielectric material, such as silicon oxide, silicon nitride, a polymer, or a combination thereof, using any suitable deposition process. The bonding features 544 may be disposed in the dielectric bonding layer 542. The bonding features 544 may be electrically conductive features formed of the same materials as the electrically conducting features 506. For example, the bonding features 544 may include tungsten (W), copper (Cu), a copper alloy, aluminum (Al), an aluminum alloy, or a combination thereof. Other suitable bonding structure materials are within the contemplated scope of disclosure. The bonding features 544 may include bonding pads and/or via structures, in some embodiments. The bonding features 544 may be formed in the dielectric bonding layer 542 by a dual-Damascene processes, or by one or more single-Damascene processes, as described above. In alternative embodiments, the bonding features 544 may be formed by an electroplating process. As described above, the first integrated passive device 206a may be formed by dicing along scribe lines 208.

Figure 6B:
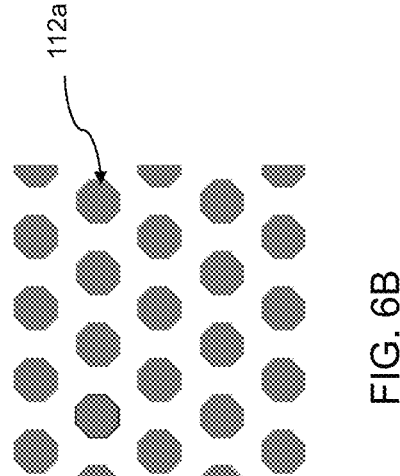
FIG. 6B is a plan view of a plurality of bonding pads in a staggered configuration, according to various embodiments.
Figure 6A:
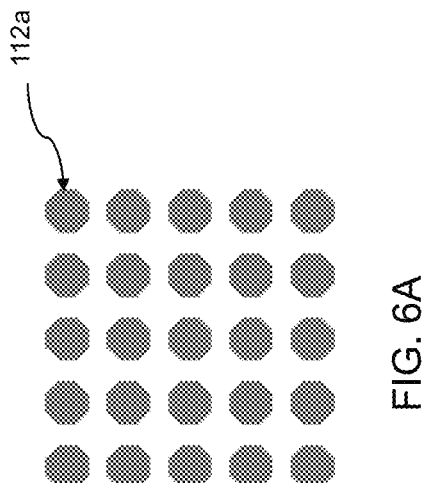
FIG. 6A is a plan view of a plurality of bonding pads or micro-bumps in an array configuration, according to various embodiments.

FIG. 6A is a plan view of a plurality of first bonding pads 112a or micro-bumps in an array configuration, and FIG. 6B is a plan view of a plurality of first bonding pads in a staggered configuration, according to various embodiments. The first bonding pads 112a may be configured to have a pitch that is in a range from approximately 20 microns to approximately 100 microns. Further, at least some of the first bonding pads 112a may have a spacing corresponding to a spacing of electrical bonding pads or micro-bumps (not shown) of the interposer 108. In this way, the integrated passive device dies 106 may be configured to be electrically connected to the interposer 108 by bonding the at least some of the first bonding pads 112a of the integrated passive device dies 106 to respective bonding pads or micro-bumps (not shown) of the interposer 108.

Figure 7:
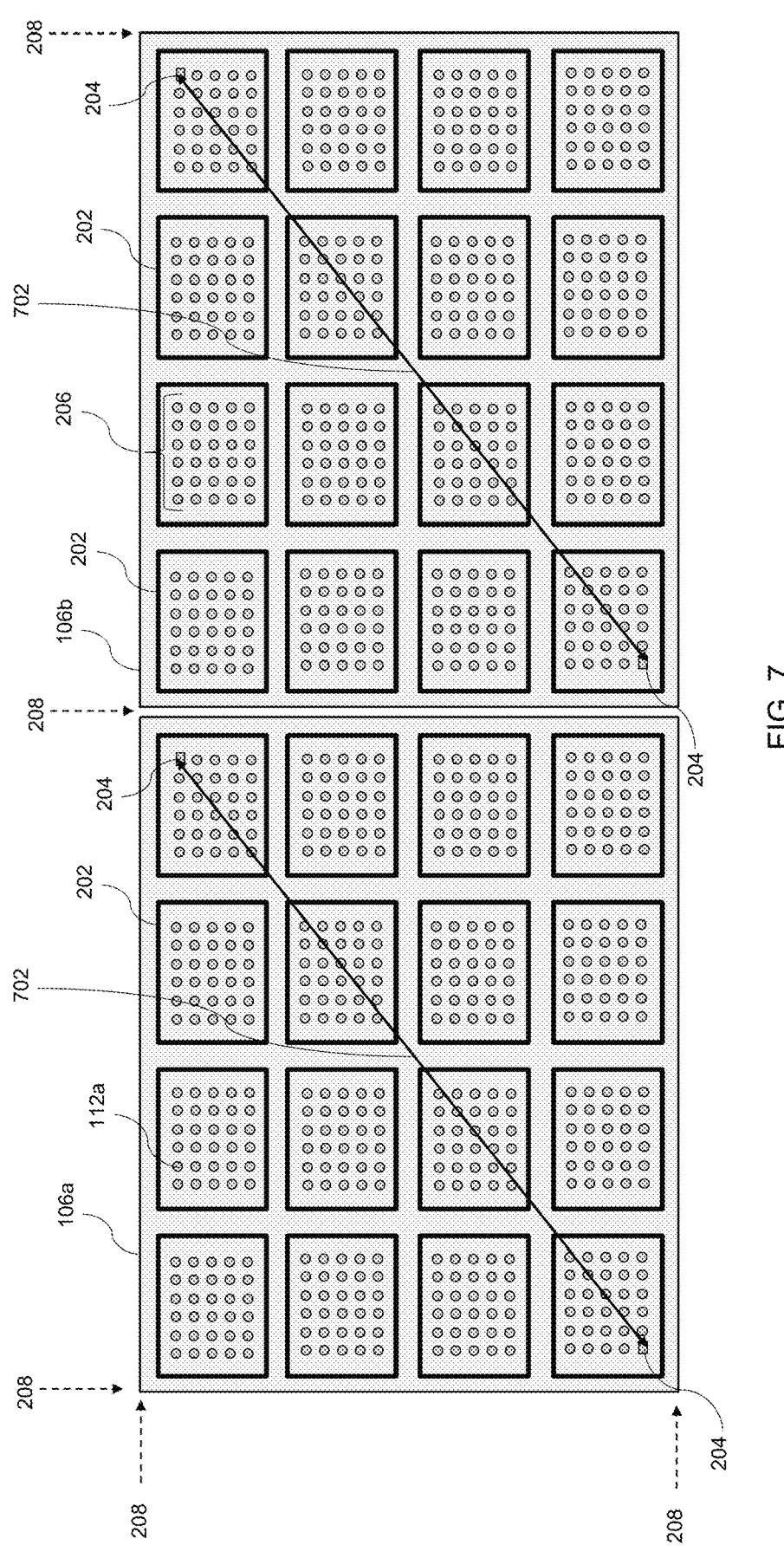
FIG. 7 is a bottom-up view of a structure including a first integrated passive device die and a second integrated passive device die formed by dicing a semiconductor wafer along a first plurality of scribe lines, according to various embodiments.

FIG. 7 is a bottom-up view of a structure including a first integrated passive device die 106a and a second integrated passive device die 106b formed by dicing a semiconductor wafer 414 (e.g., see FIG. 4A) along a plurality of scribe lines 208, according to various embodiments. In this example embodiment, each of the first integrated passive device die 106a and the second integrated passive device die 106b include sixteen integrated passive devices 206 that are each formed within an area enclosed by a respective seal ring 202. Each of the first integrated passive device die 106a and the second integrated passive device die 106b may include passive electrical circuit components, as described in greater detail with reference to FIGS. 5A and 5B above. Each of the first integrated passive device die 106*a* and the second integrated passive device die 106*b* may include first bonding pads 112*a*.

Some of the integrated passive devices 206 may include one or more alignment marks 204. In this example embodiment, each of the first integrated passive device die 106*a* and the second integrated passive device die 106*b* may include two integrated passive devices 206 having alignment marks 204. As shown in FIG. 7, the alignment marks 204 may be formed in integrated passive devices 206 located at top right and bottom left corners of each of the first integrated passive device die 106*a* and the second integrated passive device die 106*b*. As such, a distance 702 between the alignment marks 204 may correspond to a size of the integrated passive device die (e.g., the first integrated passive device die 106*a* and the second integrated passive device die 106*b*) generated by dicing a substrate (e.g., semiconductor wafer 414 of FIG. 4A) along the plurality of scribe lines 208 to generate the integrated passive device dies (106*a*, 106*b*). The substrate (e.g., semiconductor wafer 414 of FIG. 4A) may include various types of alignment marks that may be used to singulate the substrate to thereby generate various integrated passive device dies 106 having user-selective sizes. For example, the distance 702 between the alignment marks 204 may be approximately 2 mm. In other embodiments, the distance 702 may be larger or smaller than 2 mm.

Figure 8:
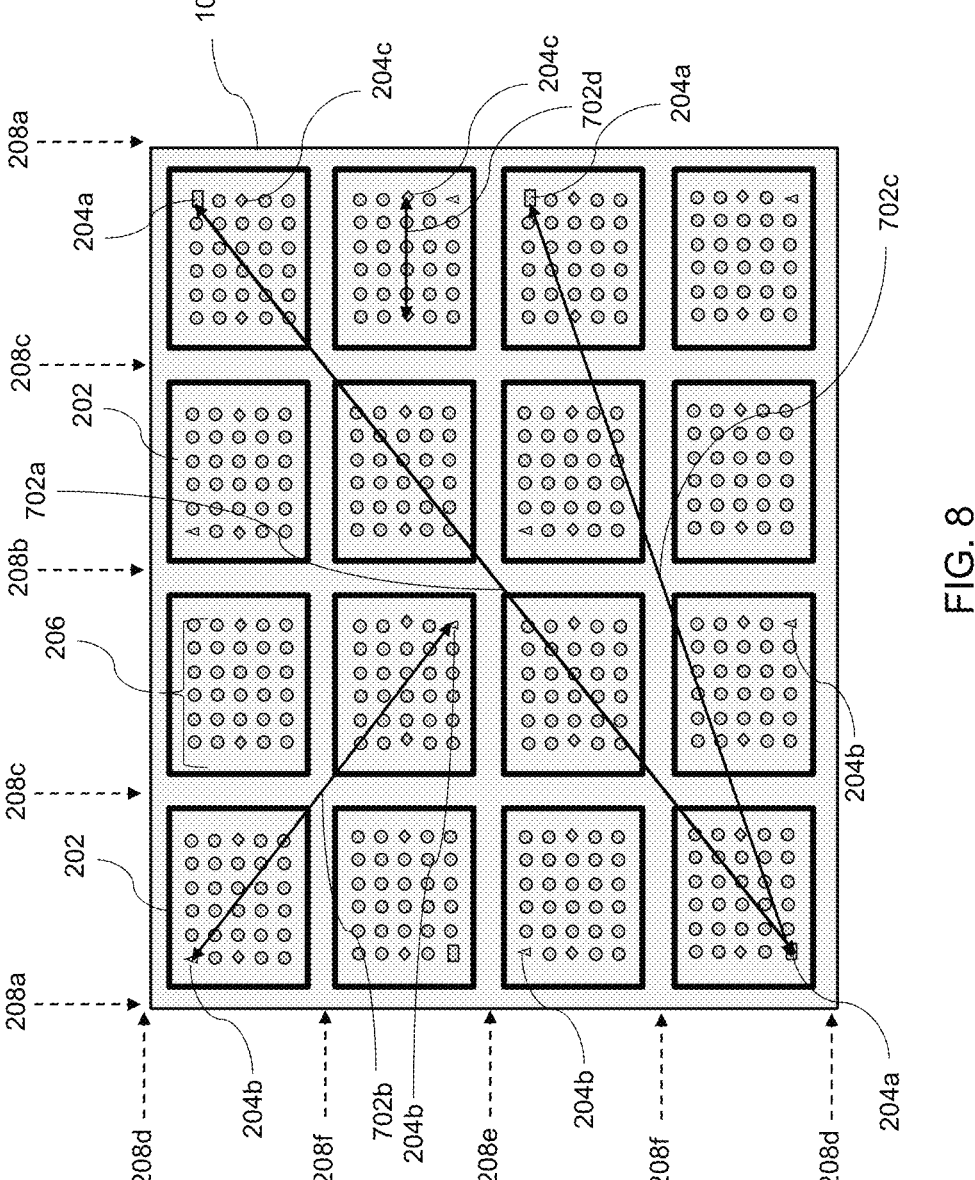
FIG. 8 is a bottom-up view of a portion of a substrate including a plurality of integrated passive devices having a plurality of first alignment marks, a plurality of second alignment marks, and a plurality of third alignment marks, according to various embodiments.

FIG. 8 is a bottom-up view of a portion of a substrate (e.g., semiconductor wafer 414 of FIG. 4A), including a plurality of integrated passive devices 206, each located within an area enclosed by a respective seal ring 202, according to various embodiments. The portion of the substrate may include a plurality of first alignment marks 204*a*, a plurality of second alignment marks 204*b*, and a plurality of third alignment marks 204*c*. The portion of the substrate may further include a plurality of first scribe lines 208*a*, a plurality of second scribe lines 208*b*, a plurality of third scribe lines 208*c*, a plurality of fourth scribe lines 208*d*, a plurality of fifth scribe lines 208*e*, and a plurality of sixth scribe lines 208*f*. The arrangement of integrated passive devices 206, seal rings 202, alignment marks (204*a*, 204*b*, 204*c*), and scribe lines (208*a*, 208*b*, 208*c*, 208*d*, 208*e*, 208*f*) may be considered to be located within a single repeat unit of a two-dimensional array of similar repeat units formed on a substrate.

Various integrated passive device dies, having different shapes and sizes, may be formed by dicing the substrate along various subsets of the scribe lines (208*a*, 208*b*, 208*c*, 208*d*, 208*e*, 208*f*). For example, a first type integrated passive device die 106 may be formed by dicing along scribe lines 208*a* and 208*d*. The integrated passive device die 106 formed in this way may have a size corresponding to a first distance 702*a* (e.g., see FIG. 7 and related description, above). In this example embodiment, the first distance 702*a* may correspond to a distance between first alignment marks 204*a* located diagonally across from one another at opposite corners of the integrated passive device die 106. The integrated passive device die 106 formed in this way may have a square shape and may include sixteen integrated passive devices 206. In other embodiments, the substrate may be diced in other ways to generate integrated passive device dies (106, 106*a*, 106*b*) having sizes corresponding to a second distance 702*b*, a third distance 702*c*, and a fourth distance 702*d*, as described in greater detail with reference to FIGS. 9 to 11, respectively, below.

Figure 9:
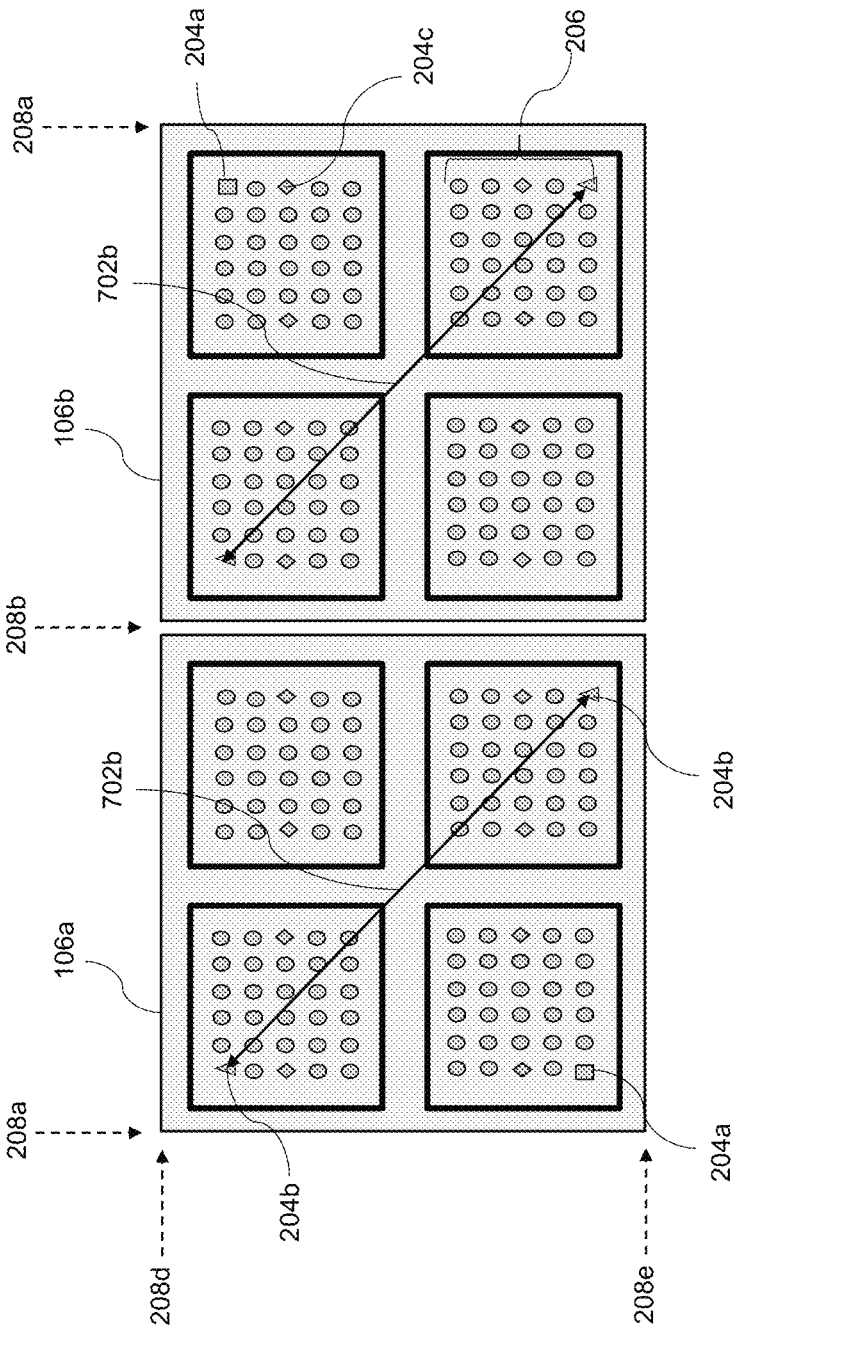
FIG. 9 is a bottom-up view of a structure including a first integrated passive device die and a second integrated passive device die formed by dicing a semiconductor wafer along a second plurality of scribe lines, according to various embodiments.

FIG. 9 is a bottom-up view of a structure including a first integrated passive device die 106*a* and a second integrated passive device die 106*b* formed by dicing a semiconductor wafer (e.g., semiconductor wafer 414 of FIG. 4A) along a second plurality of scribe lines, according to various embodiments. In this regard, a second type of integrated passive device die (106*a*, 106*b*) may be formed by dicing the substrate along the first scribe lines 208*a*, the second scribe lines 208*b*, the fourth scribe lines 208*d*, and the fifth scribe lines 208*e*. The integrated passive device die (106*a*, 106*b*) formed in this way may have a size corresponding to a second distance 702*b*, as shown in FIG. 9. The distance 702*b* may correspond to a distance between neighboring second alignment marks 204*b*. Each integrated passive device die (106*a*, 106*b*) formed in this way may have a square shape and may include four integrated passive devices 206, as shown in FIG. 9.

Figure 10:
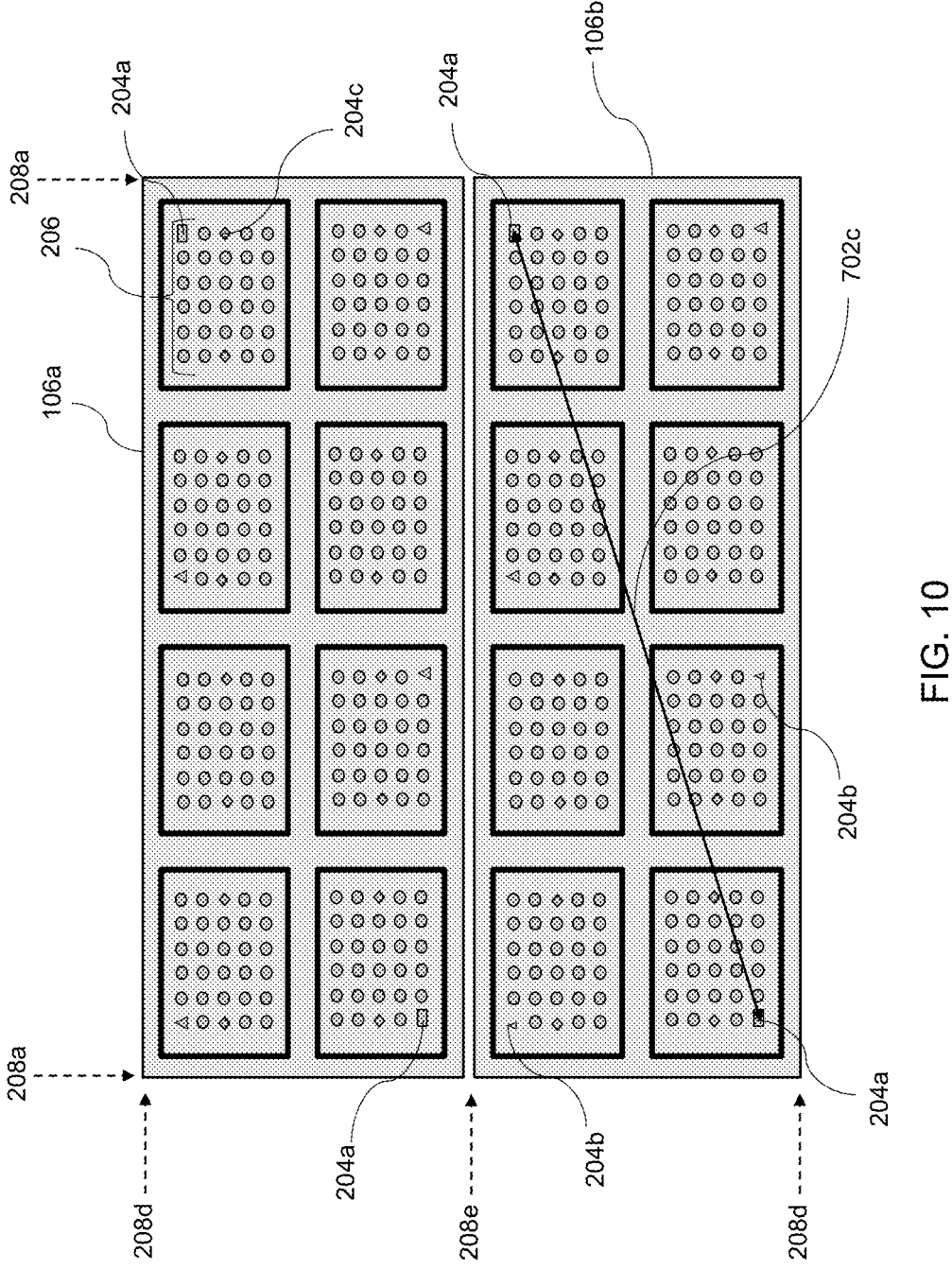
FIG. 10 is a bottom-up view of a structure including a first integrated passive device die and a second integrated passive device die each having a rectangular shape, according to various embodiments.

FIG. 10 is a bottom-up view of a structure including a first integrated passive device die 106*a* and a second integrated passive device die 106*b*, each having a rectangular shape, according to various embodiments. In this regard, a third type of integrated passive device die (106*a*, 106*b*) may be formed by dicing the substrate along the first scribe lines 208*a*, along the fourth scribe lines 208*d*, and along the fifth scribe lines 208*e*. The integrated passive device die (106*a*, 106*b*) formed in this way may have a size corresponding to a third distance 702*c*, as shown in FIG. 10. The distance 702*c* may correspond to a distance between neighboring first alignment marks 204*a* located at opposite corners of the integrated passive device die (106*a*, 106*b*). As shown in FIG. 10, each integrated passive device die (106*a*, 106*b*) formed in this way may have a rectangular shape and may include eight integrated passive devices 206.

Figure 11:
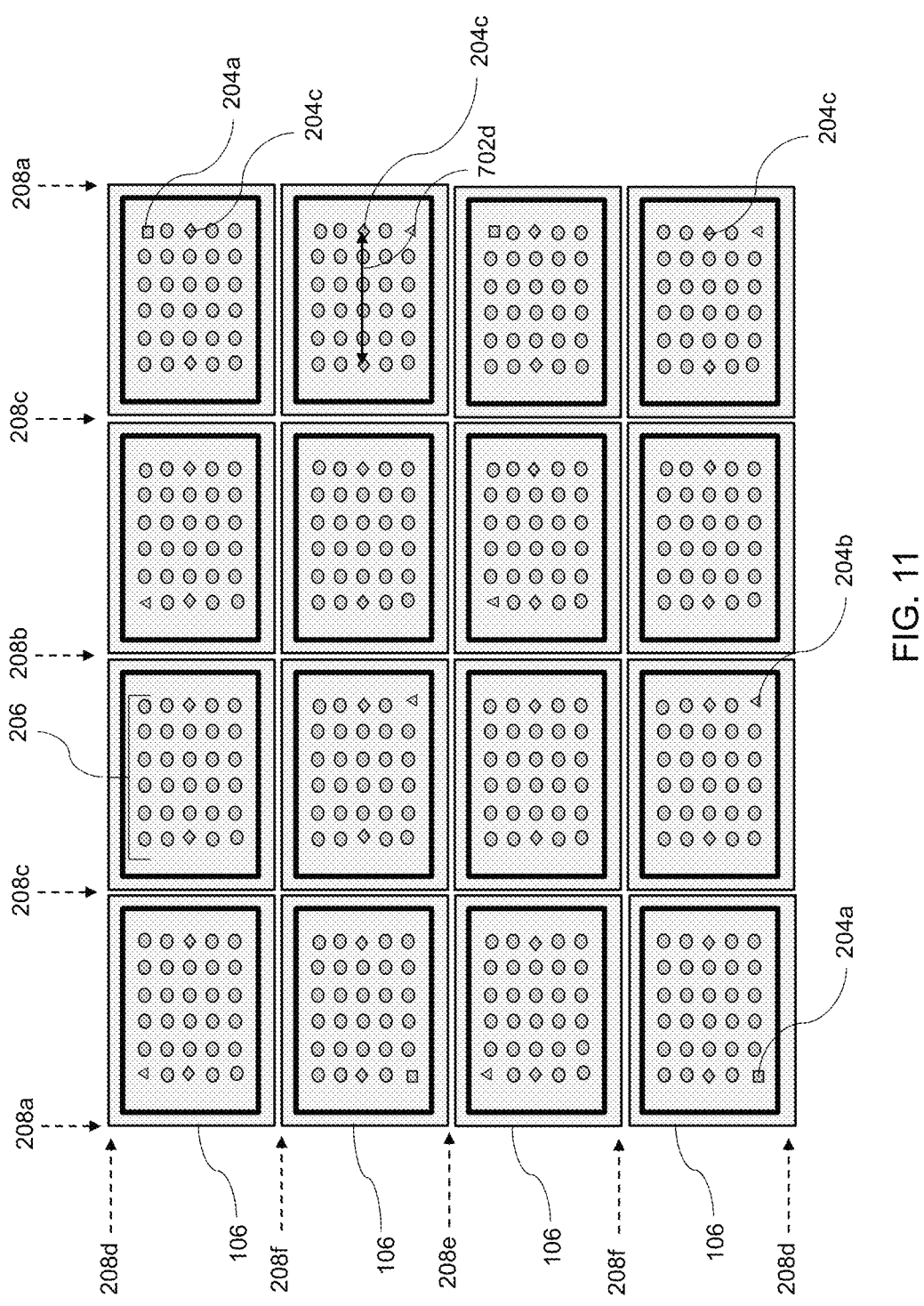
FIG. 11 is a bottom-up view of a structure including a plurality of integrated passive device dies each having a single integrated passive device, according to various embodiments.

FIG. 11 is a bottom-up view of a structure including a plurality of integrated passive device dies 106 each having a single integrated passive device 206, according to various embodiments. In this regard, a fourth type of integrated passive device die may be formed by dicing the substrate along all of the scribe lines (208*a*, 208*b*, 208*c*, 208*d*, 208*e*, 208*f*) shown in FIGS. 8 and 11. The integrated passive device dies 106 formed in this way may have a size corresponding to a fourth distance 702*d*, as shown in FIG. 11. The distance 702*d* may correspond to a distance between neighboring third alignment marks 204*c*. The integrated passive device die (106*a*, 106*b*) formed in this way may have a square shape and may include a single integrated passive device 206.

The above-described example embodiments (e.g., see FIGS. 8 to 11) included three types of alignment marks (204*a*, 204*b*, 204*c*) and six sets of scribe lines (208*a*, 208*b*, 208*c*, 208*d*, 208*e*, 208*f*). By dicing the substrate in various ways, a number of different types of integrated passive device dies (106, 106*a*, 106*b*) may be formed (e.g., see FIGS. 7 to 11 and related description, above). The above examples illustrate only a few of the ways that a substrate may be diced to generate integrated passive device dies (106, 106*a*, 106*b*). Other embodiments may include greater or fewer types of alignment marks and scribe lines. In general, an integrated passive device die (106, 106*a*, 106*b*) may be generated having any integer number of integrated passive devices 206 by dicing the substrate along an appropriate choice of scribe lines. Further, in certain embodiments, the alignment marks may all have a common shape and size. In other embodiments there may be two types of alignment marks, three types of alignment marks, four types of alignment marks, etc., having respective sizes, shapes, and spacings. Regardless, in each of the illustrated embodiments shown in FIGS. 7-11, each integrated passive device die unit 206 is provided with its own respective seal ring 202. In this manner, regardless of the size and shape of the overall integrated passive device die (e.g., 106, 106*a*, 106*b*), the integrated passive device die unit 206 may be protected from contamination due to the cutting/sawing of the die. Thus, overall yield may be improved.

As shown in FIGS. 8-11, certain ones of the integrated passive devices 206 may include first alignment marks 204*a* and/or second alignment marks 204*b*, as described above with reference to FIG. 8. The second alignment marks 204*b*, along with the first alignment marks 204*a*, may be used to align the integrated passive device dies (106, 106*a*, 106*b*) during a process of attaching the integrated passive device dies (106, 106*a*, 106*b*) to an interposer 108 (e.g., see FIG. 1B). Alternatively, one or other of the first alignment marks 204*a* and the second alignment marks 204*b* may be super-fluous for alignment of the integrated passive device dies (106, 106*a*, 106*b*).

As described above with reference to FIGS. 7 to 11, a substrate (e.g., semiconductor wafer 414 of FIG. 414) may include a plurality of scribe lines (208, 208*a*, 208*b*, 208*c*, 208*d*, 208*e*, 208*f*) and two or more alignment marks (204*a*, 204*b*, 204*c*). The alignment marks (204, 204*a*, 204*b*, 204*c*) and the scribe lines (208*a*, 208*b*, 208*c*, 208*d*, 208*e*, 208*f*) may each be configured as a periodic array. For example, the first alignment marks 204*a* may have a first pitch (e.g., the first distance 702*a* or the third distance 702*c*) and the second alignment marks 204*b* may have a second pitch (e.g., second distance 702*b*), as described above with reference to FIGS. 8 and 10. As such, the first pitch may correspond to a first user-selectable size (e.g., the first distance 702*a*) of the integrated passive device die (106, 106*a*, 106*b*) that may be generated by dicing the substrate (e.g., see FIGS. 7 and 8), and the second pitch may correspond to a second user-selectable size (e.g., the second distance 702*b*) of the inte-grated passive device die 106*b* that is generated by dicing the substrate (e.g., see FIGS. 8 and 9).

In this way, the substrate (e.g., semiconductor wafer 414 of FIG. 414) may be considered to a be first substrate having a first plurality of integrated passive devices 206 formed thereon (e.g., see FIG. 4A) and the integrated passive device die 106 (e.g., see FIG. 4B) may be thought of as a second substrate having a second plurality of integrated passive devices 206, such that the second substrate is a portion of the first substrate and the second plurality of integrated passive devices 206 is a subset of the first plurality of integrated passive devices 206. Further, as described above, each of the integrated passive devices 206 may include a seal ring 202 that may enclose the passive electrical circuits 206 (e.g., each integrated passive device 206 may located withing an area enclosed by a seal ring 202). As mentioned above, each of the scribe lines (208*a*, 208*b*, 208*c*, 208*d*, 208*e*, 208*f*) may be a physical mark formed on the integrated passive device die 106*b*. Alternatively, scribe lines (208*a*, 208*b*, 208*c*, 208*d*, 208*e*, 208*f*) may correspond to spaces formed adjacent seal rings 202 without any additional marks associated with each scribe line (208*a*, 208*b*, 208*c*, 208*d*, 208*e*, 208*f*). In this regard, forming the seal rings 202 having spaces between adjacent seal rings 202 implicitly forms the scribe lines (208*a*, 208*b*, 208*c*, 208*d*, 208*e*, 208*f*).

FIG. 12A is a top cross-sectional view of an intermediate structure 1200 that may be used in the formation of an integrated circuit die having alignment marks 204, and FIG. 12B is a vertical cross-sectional view of the intermediate structure 1200 of FIG. 12A, according to an embodiment. The cross-sectional view of FIG. 12B corresponds to the cross-section B-B' indicated in FIG. 12A. FIGS. 12A and 12B illustrate a portion of a structure (e.g., a portion of the semiconductor wafer 414 of FIG. 4A) having die regions 1201 separated by scribe lines 208 (also referred to as dicing lines or dicing streets). As described above, the intermediate structure 1200 may be diced along the scribe lines 208 to form individual integrated circuit dies (such as an integrated passive device dies 106).

As shown in FIG. 12B, for example, the intermediate structure 1200 may include a semiconductor substrate 1205, one or more active and/or passive devices 1211 formed on the semiconductor substrate 1205, and one or more metal-lization layers 1213 formed over the semiconductor sub-strate 1205. In some embodiments, the semiconductor sub-strate 1205 may be formed of silicon, although it may also be formed of other group III, group IV, and/or group V elements, such as silicon, germanium, gallium, arsenic, and combinations thereof. The semiconductor substrate 1205 may also be in the form of silicon-on-insulator (SOI). The SOI substrate may include a layer of a semiconductor material (e.g., silicon, germanium, etc.) formed over an insulator layer (e.g., a buried oxide layer), which may be formed on a silicon substrate. In addition, other substrates that may be used include multi-layered substrates, gradient substrates, hybrid orientation substrates, and any combina-tions thereof. In other embodiments, the semiconductor substrate 1205 may include a dielectric material such as silicon oxide, aluminum oxide, etc., or a combination thereof.

In some embodiments, the one or more active and/or passive devices 1211 may include various n-type metal-oxide semiconductor (NMOS) and/or p-type metal-oxide semiconductor (PMOS) devices such as transistors, capaci-tors, resistors, diodes, photo-diodes, fuses and/etc. In some embodiments, the integrated circuit dies may be discrete semiconductor device chips (sometimes referred to as sur-face mount devices (SMDs)) or integrated passive device dies 106 (e.g., described above with reference to FIGS. 5A and 5B). In such embodiments, the semiconductor substrate 1205 may include various devices such as RLC circuits, capacitors, inductors, transformers, baluns, micro-stripes, co-planar waveguides, etc., and may be substantially free of active devices.

The one or more metallization layers 1213 may include an inter-layer dielectric (ILD)/inter-metal dielectric layers (IMDs) formed over the semiconductor substrate 1205. The ILD/IMDs may be formed, for example, of a low-k dielec-tric material, such as phosphosilicate glass (PSG), borophos-phosilicate glass (BPSG), FSG, SiO, Cy, Spin-On-Glass, Spin-On-Polymers, silicon carbon material, compounds thereof, composites thereof, combinations thereof, etc., using various methods, such as a spin-on coating method, chemical vapor deposition (CVD), plasma enhanced CVD (PECVD), etc., or a combination thereof. In some embodi-ments, interconnect structures may be formed in the ILD/IMDs using, for example, a damascene process, a dual damascene process, etc. In some embodiments, interconnect structures may include copper, a copper alloy, silver, gold, tungsten, tantalum, aluminum, etc. In some embodiments, the interconnect structures may provide electrical connec-tions between the one or more active and/or passive devices 1211 formed on the semiconductor substrate 1205.

In some embodiments, top views of the die regions 1201 (e.g., see FIG. 12A) and, consequently, top views of inte-grated circuit dies that are formed after dicing the interme-diate structure 1200 may be geometrically symmetrical under 90°, 180°, and/or 270° rotations. However, the die regions 1201 and, consequently, integrated circuit dies that are formed after dicing the intermediate structure 1200 may not be functionally symmetrical under 90°, 180°, and/or 270° rotations. Such an asymmetry of integrated circuit dies may be caused by an asymmetrical arrangement of various active and/or passive devices in integrated circuit dies. Accordingly, one or more alignment marks 204 may be formed on each integrated circuit die to identify a desired orientation of integrated circuit dies.

In some embodiments, first bonding pads 112a and alignment marks 204 may be formed over the one or more metallization layers 1213. The first bonding pads 112a may be electrically coupled to the one or more active and/or passive devices 1211 through the one or more metallization layers 1213, while the alignment marks 204 may be electrically isolated from the one or more active and/or passive devices 1211. In some embodiments, the first bonding pads 112a and the alignment marks 204 may include a conductive material such as aluminum, copper, tungsten, silver, gold, etc., or a combination thereof. In some embodiments, a conductive material may be formed over the semiconductor substrate 1205 and the one or more active and/or passive devices 1211 using, for example, physical vapor deposition (PVD), atomic layer deposition (ALD), electro-chemical plating, electroless plating, etc., or a combination thereof. Subsequently, the conductive material may be patterned to form the first bonding pads 112a and the alignment marks 204. Accordingly, the first bonding pads 112a and the alignment marks 204 may have a common thickness and may share a common material.

In some embodiments, the conductive material may be patterned using photolithography techniques. Generally, photolithography techniques involve depositing a photoresist material (not shown), which is subsequently irradiated (exposed) and developed to remove a portion of the photoresist material. The remaining photoresist material protects the underlying material, such as the conductive material of the first bonding pads 112a and the alignment mark 204 from subsequent processing steps, such as etching. A suitable etching process, such as a reactive ion etch (RIE) or other dry etch, an isotropic or anisotropic wet etch, or any other suitable etch or patterning process may be applied to the conductive material to remove exposed portions of the conductive material and form the first bonding pads 112a and the alignment marks 204. In some embodiments wherein the conductive material is aluminum, the conductive material may be etched using a mixture of 80% phosphoric acid, 5% nitric acid, 5% acetic acid, and 10% de-ionized (DI) water. Subsequently, the photoresist material may be removed using, for example, an ashing process followed by a wet clean process. As described below in greater detail, connectors will be formed on the first bonding pads 112a.

In the illustrated embodiment, top-view shapes of the first bonding pads 112a are circle shaped, and top-view shapes of the alignment marks 204 are cross shaped (e.g., plus-sign shaped). However, in other embodiments, the top-view shapes of the first bonding pads 112a may be rectangles, ovals, or polygons such as triangles, squares, etc., and the top-view shapes of the alignment marks 204 may be ovals, or polygons such as triangles, squares, rectangles, etc. In some embodiments, the top-view shapes of the first bonding pads 112a and the alignment marks 204 may be similar. In other embodiments, the top-view shapes of the first bonding pads 112a and the alignment marks 204 may be different.

FIG. 12C is a vertical cross-sectional view of a further intermediate structure 1202 generated by forming a passivation layer 1219 over the intermediate structure of FIG. 12B, according to an embodiment. The passivation layer 1219 may be formed over the one or more metallization layers 1213, the first bonding pads 112a, and the alignment marks 204. The passivation layer 1219 may then be patterned to form openings 1223 over the first bonding pads 112a while leaving the alignment marks 204 covered. Metal bump structures (not shown) may then be formed over the first bonding pads 112a. In some embodiments, the passivation layer 1219 may include one or more layers of photo patternable dielectric materials such as polybenzoxazole (PB0), polyimide (PI), benzocyclobutene (BCB), or the like, and may be formed using a spin-on coating process, etc. Such photo-patternable dielectric materials may be patterned using similar photolithography methods as a photoresist material. In other embodiments, the passivation layer 1219 may include one or more layers of non-photo-patternable dielectric materials such as silicon nitride, silicon oxide, phosphosilicate glass (PSG), borosilicate glass (BSG), boron-doped phosphosilicate glass (BPSG), etc., and may be formed using chemical vapor deposition (CVD), PVD, ALD, a spin-on coating process, the like, or a combination thereof.

In some embodiments in which the passivation layer 1219 may be formed of a photo-patternable dielectric material, the passivation layer 1219 may be patterned using similar photolithography methods as a photoresist material. In other embodiments in which the passivation layer 1219 may be formed of a non-photo-patternable dielectric material, a photoresist material (not shown) may be formed over the passivation layer. The photoresist material may be subsequently irradiated (exposed) and developed to remove a portion of the photoresist material. Subsequently, exposed portions of the passivation layer 1219 may be removed using, for example, a suitable etching process to form the openings 1223. In some embodiments wherein the passivation layer 1219 may be formed of silicon oxide, the passivation layer 1219 may be etched using, for example, buffered hydrofluoric acid (HF). In other embodiments wherein the passivation layer 1219 may be formed of silicon nitride, the passivation layer 1219 may be etched using, for example, hot phosphoric acid ($H_3PO_4$). Subsequently, the photoresist material may be removed using, for example, by ashing or dissolution with a solvent.

FIG. 13 is a flowchart illustrating operations of a method 1300 of fabricating an integrated passive device die (106, 106a, 106b), according to various embodiments. In operation 1302, the method 1300 may include forming a first plurality of integrated passive devices 206 (e.g., see FIG. 4A) in or on a first substrate (semiconductor wafer 414) and a seal ring 202 around each of the first plurality of integrated passive devices 206. Each of the seal rings 202 may be located such that separations 410 between adjacent seal rings 202 may form a plurality of scribe lines (208, 208a, 208b, 208c, 208d, 208e, 208f) (e.g., see FIGS. 4C, 8, and 12A). The plurality of scribe lines (208, 208a, 208b, 208c, 208d, 208e, 208f) may be formed on the first substrate (e.g., see FIGS. 8 and 12A) such that the first substrate may be diced along one or more of the plurality of scribe lines (208a, 208b, 208c, 208d, 208e, 208f) to thereby generate the integrated passive device die (106, 106a, 106b) (e.g., see FIGS. 4B, 7 to 11).

In operation 1304, the method 1300 may include forming two or more alignment marks (204, 204a, 204b, 204c) (e.g., see FIGS. 7 to 12C) on two or more respective ones of the first plurality of integrated passive devices (e.g., see FIGS. 4B and 7 to 11). A distance between two of the two or more alignment marks (204, 204*a*, 204*b*, 204*c*) may correspond to a size of the integrated passive device die 206 generated by dicing the first substrate to generate the integrated passive device die 205.

In operation 1306, the method 1300 may further include dicing the first substrate (e.g., see FIG. 4A) along one of a plurality of first scribe lines (e.g., along a first subset of scribe lines 208*a*, 208*b*, 208*c*, 208*d*, 208*e*, 208*f*) or along a second plurality of second scribe lines (e.g., along a second subset of scribe lines 208*a*, 208*b*, 208*c*, 208*d*, 208*e*, 208*f*) to thereby generate the integrated passive device die (106, 106*a*, 106*b*). In this way, a first substrate (e.g., see FIG. 4A) having a first plurality of integrated passive devices 206 may be diced such that the resulting integrated passive device die (106, 106*a*, 106*b*) may include a second substrate (e.g., see FIG. 4B) having a second plurality of integrated passive devices 206 such that the second substrate is a portion of the first substrate and the second plurality of integrated passive devices 206 is a subset of the first plurality of integrated passive devices 206.

As described above with reference to FIGS. 7 to 11, a distance (e.g., the distances 702*a*, 702*b*, 702*c*, and 702*d*) between two of the two or more alignment marks (204, 204*a*, 204*b*, 204*c*) may correspond to a size of the integrated passive device die (106, 106*a*, 106*b*) generated by dicing the first substrate. Further, the plurality of scribe lines (208*a*, 208*b*, 208*c*, 208*d*, 208*e*, 208*f*) may include a plurality of first scribe lines 208*a* and a second plurality of second scribe lines 208*b*, and forming the two or more alignment marks 204 may further include forming a plurality of first alignment marks 204*a* having a first pitch (e.g., first distance 702*a*) and a plurality of second alignment marks 204*b* having a second pitch (e.g., second distance 702*b*). As such, the first pitch may correspond to a first user-selectable size of the integrated passive device die 106*a* that is generated by dicing the first substrate along the plurality of first scribe lines 208*a*, and the second pitch may correspond to a second user-selectable size of the integrated passive device die 106*b* that is generated by dicing the first substrate along the second plurality of second scribe lines 208*b*.

The method 1300 may further include forming a plurality of micro-bump electrical connections (e.g., first bonding pads 112*a*; see FIGS. 12A to 12C) on each of first plurality of integrated passive devices 106. Forming the two or more alignment marks (204, 204*a*, 204*b*, 204*c*) may further include using the same (or similar) process that is used to form the plurality of micro-bump electrical connections (e.g., first bonding pads 112*a*) such that the two or more alignment marks (204, 204*a*, 204*b*, 204*c*) are electrically isolated from the plurality of micro-bump electrical connections (e.g., see FIGS. 12A, 12B, and related description, above). As such, the two or more alignment marks (204, 204*a*, 204*b*, 204*c*) and the plurality of micro-bump electrical connections (e.g., first bonding pads 112*a*) may include a common material (e.g., see FIGS. 12A, 12B, and related description, above).

Referring to all drawings and according to various embodiments of the present disclosure, a semiconductor device 100 (see FIGS. 1A and 1B) is provided. The semiconductor device 100 may include an interposer 108, a semiconductor die (102, 104) electrically connected to the interposer 108, and an integrated passive device die 106 electrically connected to the interposer 108. The integrated passive device die 106 may include two or more seal rings 202 (e.g., see FIG. 4B) and a first alignment mark 204*a* (e.g., see FIGS. 7 and 8) formed on the integrated passive device die (106, 106*a*, 106*b*) within a first area enclosed by a first one of the two or more seal rings 202.

The integrated passive device die (106, 106*a*, 106*b*) may further include two or more integrated passive devices 206 located within respective areas enclosed by respective ones of the two or more seal rings (see FIGS. 4A and 7 to 10). Each of the two or more integrated passive devices (106, 106*a*, 106*b*) may include electrical connections that are formed as a plurality of micro-bumps (e.g., first bonding pads 112*a*). The first alignment mark 204*a* may be electrically isolated from the electrical connections, and the first alignment mark 204*a* and the electrical connections (e.g., first bonding pads 112*a*) may share a common material (e.g., see FIGS. 12A, 12B, and related description, above).

The integrated passive device die (106, 106*a*, 106*b*) may have a rectangular shape (e.g., see FIGS. 4A and 4B) with a width that is greater than approximately 2 millimeters. The two or more seal rings 202 may each have a rectangular shape with a width 412 (e.g., see FIG. 4B) that is in a range from approximately 1 mm to approximately 3 mm. Each of the two or more seal rings 202 may have a thickness 416 that is in a range from approximately 5 microns to approximately 30 microns, and the two or more seal rings 202 may be separated from one another by a distance 410 that is in a range from approximately 80 microns to approximately 500 microns (e.g., see FIGS. 4B and 4C). The two or more seal rings 202 may be formed on a semiconductor substrate (510, 1205) having a scribe line 208 (e.g., see FIG. 4C) located between respective ones of the two or more seal rings 202. The integrated passive device die (106, 106*a*, 106*b*) may further include three or more seal rings 202, and a second alignment mark 204*b* formed on the integrated passive device die within a second area enclosed by a second one of the three or more seal rings 202 (e.g., see FIGS. 7 to 11).

According to a further embodiment, a system (e.g., semiconductor wafer 414) including integrated passive devices 106 is provided. The system may include a first substrate (e.g., semiconductor wafer 414); a first plurality of integrated passive devices 206 formed in or on the first substrate, with each of the first plurality of integrated passive devices 206 including a seal ring 202; two or more alignment marks (204, 204*a*, 204*b*, 204*c*) formed on two or more respective ones of the first plurality of integrated passive devices (206, 206*a*, 206*b*); and a plurality of scribe lines (208*a*, 208*b*, 208*c*, 208*d*, 208*e*, 208*f*) formed on the first substrate such that the first substrate may be diced along one or more of the plurality of scribe lines to thereby generate an integrated passive device die 106 (e.g., see FIGS. 4B, 12A, and 12B). The integrated passive device die 106 may include a second substrate (e.g., see FIG. 4B) having a second plurality of integrated passive devices 206 such that the second substrate is a portion of the first substrate and the second plurality of integrated passive devices 206 is a subset of the first plurality of integrated passive devices 206.

A distance (702*a*, 702*b*, 702*c*, 702*d*) between the two or more alignment marks (204*a*, 204*b*) may correspond to a size of the integrated passive device die (106*a*, 106*b*) generated by dicing the first substrate to generate the integrated passive device die (106, 106*a*, 106*b*). The distance 702*a* between the two or more alignment marks 204 (e.g., see FIG. 7) may be greater than approximately 2 mm. The plurality of scribe lines (208*a*, 208*b*, 208*c*, 208*d*, 208*e*, 208*f*) may include a plurality of first scribe lines (e.g., a first subset of scribe lines 208*a*, 208*b*, 208*c*, 208*d*, 208*e*, 208*f*) and a second plurality of second scribe lines (e.g., a second subset of scribe lines 208*a*, 208*b*, 208*c*, 208*d*, 208*e*, 208*f*).

The two or more alignment marks (204, 204a, 204b, 204c) may include a plurality of first alignment marks (e.g., 204a) having a first pitch (e.g., the first distance 702a) and a plurality of second alignment marks (e.g., 204b) having a second pitch (e.g., the second distance 702b; see FIGS. 8 and 9). The first pitch may correspond to a first user-selectable size of the integrated passive device die 106a that may be generated by dicing the first substrate along the plurality of first scribe lines (e.g., a first subset of scribe lines 208a, 208b, 208c, 208d, 208e, 208f), and the second pitch may correspond to a second user-selectable size of the integrated passive device die 106b that may be generated by dicing the first substrate along the second plurality of second scribe lines (e.g., a second subset of scribe lines 208a, 208b, 208c, 208d, 208e, 208f). Each of the first plurality of integrated passive devices 206 may include electrical connections that are formed as a plurality of micro-bumps (e.g., first bonding pads 112a). The two or more alignment marks (204, 204a, 204b, 204c) may be electrically isolated from the electrical connections, and the two or more alignment marks (204, 204a, 204b, 204c) and the electrical connections (e.g., 112a) may share a common material (see FIGS. 12A, 12B, and related description, above).

The disclosed embodiments may provide integrated passive device dies (106, 106a, 106b), and methods of forming the same, which may have advantages over existing integrated passive device dies. In this regard, existing integrated passive device dies (e.g., see FIG. 3) may have fixed size and electrical properties. As such, circuit designs may be limited by existing integrated passive device dies. In contrast, the disclosed integrated passive device dies (106, 106a, 106b) may be chosen to have a plurality of integrated passive devices 206. Further, a number of integrated passive devices 206 on an integrated passive device die (106, 106a, 106b) may be chosen by the way in which the semiconductor wafer 414 (e.g., see FIG. 4A) is diced. As such, a plurality of different types of integrated passive device dies (106, 106a, 106b), having different sizes and numbers of integrated passive devices 206, may be generated by dicing the semiconductor wafer 414 in various ways. As such, the disclosed systems and methods may allow greater flexibility in the design and fabrication of integrated passive device dies (106, 106a, 106b) relative to existing approaches.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:
1. A semiconductor device, comprising:
an interposer;
an integrated passive device die electrically connected to the interposer, the integrated passive device die comprising two or more seal rings;
a first alignment mark formed on the integrated passive device die within a first area enclosed by a first one of the two or more seal rings; and
a scribe line located between respective ones of the two or more seal rings.

2. The semiconductor device of claim 1, wherein the integrated passive device die further comprises two or more integrated passive devices located within respective areas enclosed by respective ones of the two or more seal rings.

3. The semiconductor device of claim 2, wherein each of the two or more integrated passive devices comprise electrical connections that are formed as a plurality of micro-bumps, and wherein the first alignment mark is electrically isolated from the electrical connections.

4. The semiconductor device of claim 3, wherein the first alignment mark and the electrical connections comprise a common material.

5. The semiconductor device of claim 1, wherein the integrated passive device die has a rectangular shape with a width that is greater than approximately 2 millimeters.

6. The semiconductor device of claim 1, wherein the two or more seal rings each have a rectangular shape with a width that is in a range from approximately 1 mm to approximately 3 mm.

7. The semiconductor device of claim 1, wherein each of the two or more seal rings has a thickness that is in a range from approximately 5 microns to approximately 30 microns.

8. The semiconductor device of claim 1, wherein the two or more seal rings are separated from one another by a distance that is in a range from approximately 80 microns to approximately 500 microns.

9. The semiconductor device of claim 2, wherein the two or more integrated passive devices are adjacent to one another in plan view.

10. The semiconductor device of claim 1, wherein the integrated passive device die further comprises:
three or more seal rings; and
a second alignment mark formed on the integrated passive device die within a second area enclosed by a second one of the three or more seal rings.

11. A semiconductor device, comprising:
an interposer;
an integrated passive device die electrically connected to the interposer, the integrated passive device die comprising a plurality of integrated passive devices, wherein the plurality of integrated passive devices are adjacent to one another in plan view; and
two or more seal rings located in the integrated passive device die, wherein each seal ring surrounds at least one integrated passive device in the plurality of integrated passive devices.

12. The semiconductor device of claim 11, wherein the two or more seal rings are disposed at different depths within a multilayer structure of the integrated passive device die.

13. The semiconductor device of claim 11, wherein at least one of the two or more seal rings comprises a conductive material configured to function as an electromagnetic shield for at least one of the plurality of integrated passive devices.

14. The semiconductor device of claim 11, wherein at least one of the two or more seal rings is electrically connected to a ground plane of the integrated passive device die.

15. The semiconductor device of claim 11, wherein the two or more seal rings define an enclosed region, and a conductive via extends through a dielectric layer within the enclosed region.

16. A semiconductor device, comprising:
an interposer;
an integrated passive device die electrically connected to the interposer, the integrated passive device die comprising a plurality of integrated passive devices, wherein the plurality of integrated passive devices are adjacent to one another in plan view; and a plurality of micro-bumps electrically connecting the integrated passive device die to the interposer, wherein at least a portion of the plurality of micro-bumps are located within an area enclosed by at least one of two or more seal rings of the integrated passive device die.

17. The semiconductor device of claim 16, wherein the plurality of micro-bumps comprises at least one subset of micro-bumps that are electrically connected to respective ones of the plurality of integrated passive devices.

18. The semiconductor device of claim 16, wherein the plurality of micro-bumps comprises a first subset of micro-bumps configured to transmit a power signal and a second subset of micro-bumps configured to transmit a data signal.

19. The semiconductor device of claim 16, wherein at least one of the plurality of micro-bumps is located in an area enclosed by a first one of the two or more seal rings and electrically connected to a ground plane of the integrated passive device die.

20. The semiconductor device of claim 16, wherein the plurality of micro-bumps are arranged in a grid pattern within an area enclosed by at least one of the two or more seal rings.

* * * * *